(12) United States Patent
Abe et al.

(10) Patent No.: US 6,990,597 B2
(45) Date of Patent: Jan. 24, 2006

(54) CLOCK GENERATION CIRCUIT, DATA TRANSFER CONTROL DEVICE, AND ELECTRONIC INSTRUMENT

(75) Inventors: Akira Abe, Sapporo (JP); Yoshiyuki Kamihara, Sapporo (JP); Shoichiro Kasahara, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 880 days.

(21) Appl. No.: 09/974,796

(22) Filed: Oct. 12, 2001

(65) Prior Publication Data

US 2002/0056069 A1 May 9, 2002

(30) Foreign Application Priority Data

Oct. 19, 2000 (JP) ............................. 2000-319722
Mar. 30, 2001 (JP) ............................. 2001-098349

(51) Int. Cl.
*G11B 5/35* (2006.01)
(52) U.S. Cl. ...................... 713/500; 713/501; 375/257; 375/372; 3620/63; 3620/65; 327/3; 327/10
(58) Field of Classification Search ............... 713/500, 713/501; 375/257, 372; 360/63, 65
See application file for complete search history.

(56) References Cited

U.S. PATENT DOCUMENTS 5,341,031 A * 8/1994 Kinoshita et al. ........... 327/259
5,553,104 A * 9/1996 Takashi et al. .............. 375/373
5,793,246 A * 8/1998 Vest et al. ................... 327/536

(Continued)

FOREIGN PATENT DOCUMENTS

JP A 63-076640 4/1988

(Continued)

OTHER PUBLICATIONS

Lueker, Jon et al., USB 2.0 Transceiver Macrocell Interface (UTMI) Specification, Verson 1.0rc, Apr. 25, 2000.

(Continued)

*Primary Examiner*—A. Elamin
(74) *Attorney, Agent, or Firm*—Oliff & Berridge, PLC

(57) ABSTRACT

A clock generation circuit capable of generating a high-frequency clock with a simple circuit configuration, together with a data transfer control device and an electronic instrument using the same. The clock generation circuit has: serially-connected inversion circuits IV0 to IV4 in which an output of IV4 is connected to an input of IV0 by a feedback line FL; and buffer circuits BF0 to BF4 which receives outputs from IV0 to IV4. The inversion circuits IV0 to IV4 are disposed along a line LN1 and the buffer circuits BF0 to BF4 are disposed along a line LN2 that is parallel to the feedback line FL but different from LN1. Dummy lines DL0 to DL3 each of which having parasitic capacitance that is equal to that of the feedback line FL are connected to the inversion circuits IV0 to IV3, to equalize the phase differences between clocks CK0 to CK4. The feedback line FL and the dummy lines DL0 to DL3 are disposed in a region between the inversion circuits IV0 to IV4 and the buffer circuits BF0 to BF4. Between which edges of multi-phase clocks an edge of data (data transferred in USB 2.0 HS mode) is located is detected, and a clock selected on the basis of edge detection information is set as a sampling clock.

44 Claims, 31 Drawing Sheets

U.S. PATENT DOCUMENTS

| | | | |
|---|---|---|---|
| 5,872,741 A * | 2/1999 | Abo | 365/233 |
| 5,963,501 A * | 10/1999 | Lee et al. | 365/233 |
| 6,084,805 A * | 7/2000 | Pawlowski | 365/194 |
| 6,138,246 A * | 10/2000 | Petty | 713/500 |
| 6,147,532 A * | 11/2000 | Ueda | 327/158 |
| 6,169,704 B1 * | 1/2001 | Sher | 365/233 |
| 6,236,260 B1 * | 5/2001 | Vest et al. | 327/536 |
| 6,256,260 B1 * | 7/2001 | Shim et al. | 365/233 |
| 6,346,828 B1 * | 2/2002 | Rosen et al. | 326/56 |
| 6,429,713 B2 * | 8/2002 | Nakaizumi | 327/218 |
| 6,445,644 B2 * | 9/2002 | Sher | 365/233 |
| 6,518,808 B2 * | 2/2003 | Shimoda | 327/172 |
| 6,577,554 B2 * | 6/2003 | Song et al. | 365/233 |
| 6,603,817 B1 * | 8/2003 | Hamamoto et al. | 375/257 |

FOREIGN PATENT DOCUMENTS

| | | |
|---|---|---|
| JP | A 01-296734 | 11/1989 |
| JP | A 02-107036 | 4/1990 |
| JP | 8-274592 | 10/1996 |
| JP | A 09-036849 | 2/1997 |
| JP | A 10-070441 | 3/1998 |
| JP | A 11-308204 | 5/1999 |

OTHER PUBLICATIONS

U.S. Appl. No. 09/977,338, filed Oct. 2001, Kamihara.

* cited by examiner

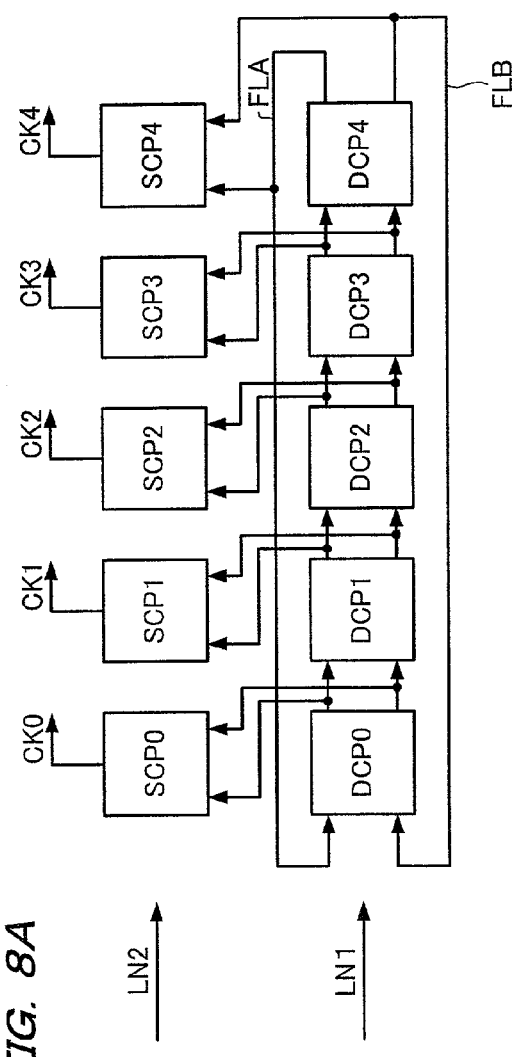
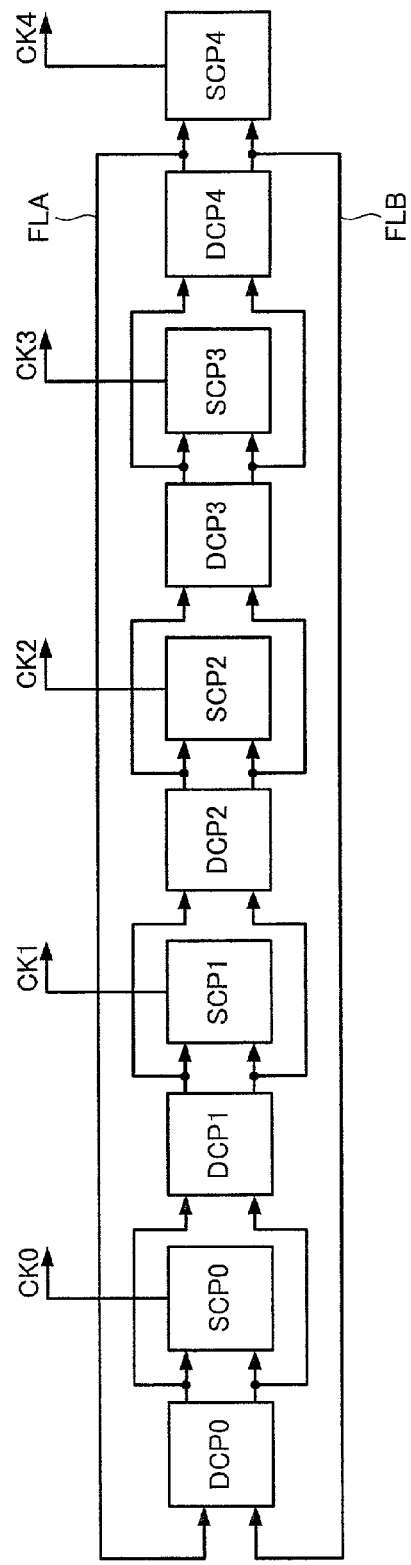
FIG. 8A
FIG. 8B

FIG. 19

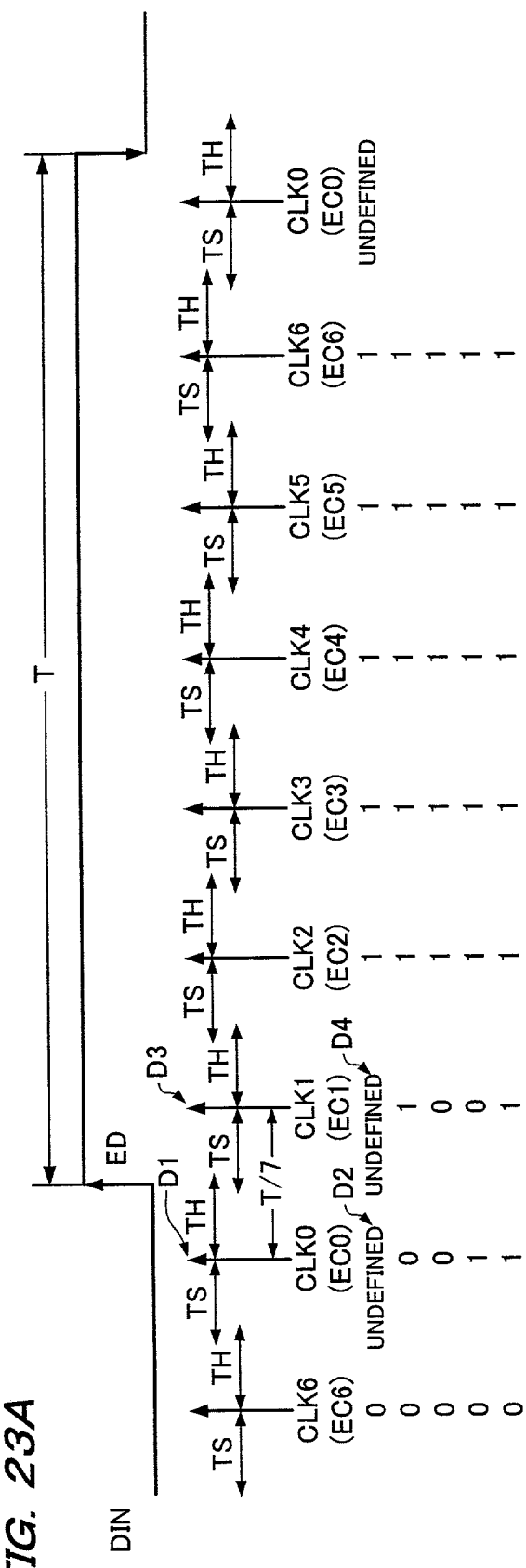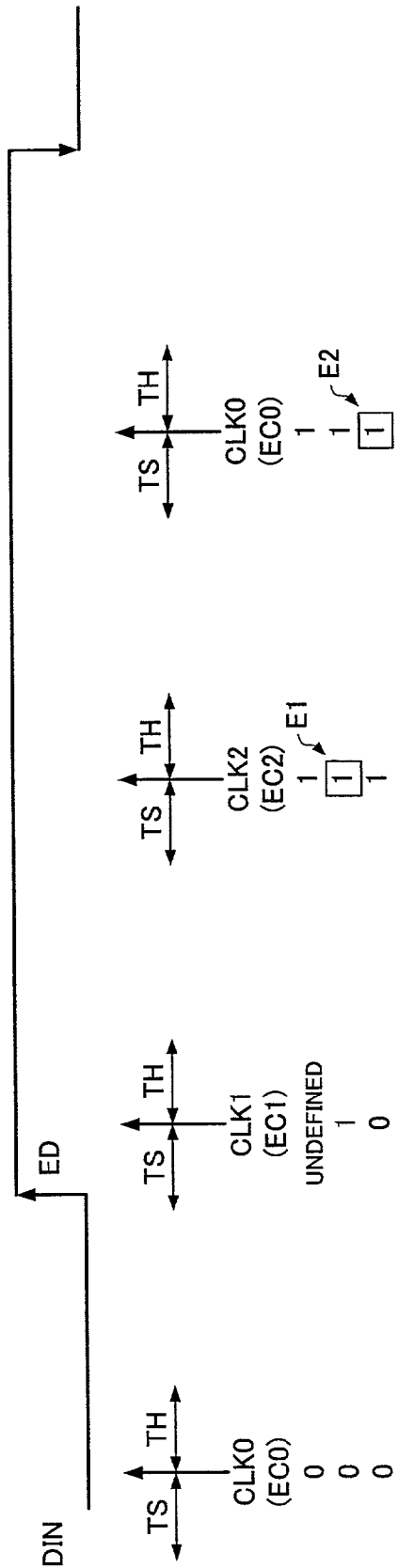
FIG. 23A
FIG. 23B

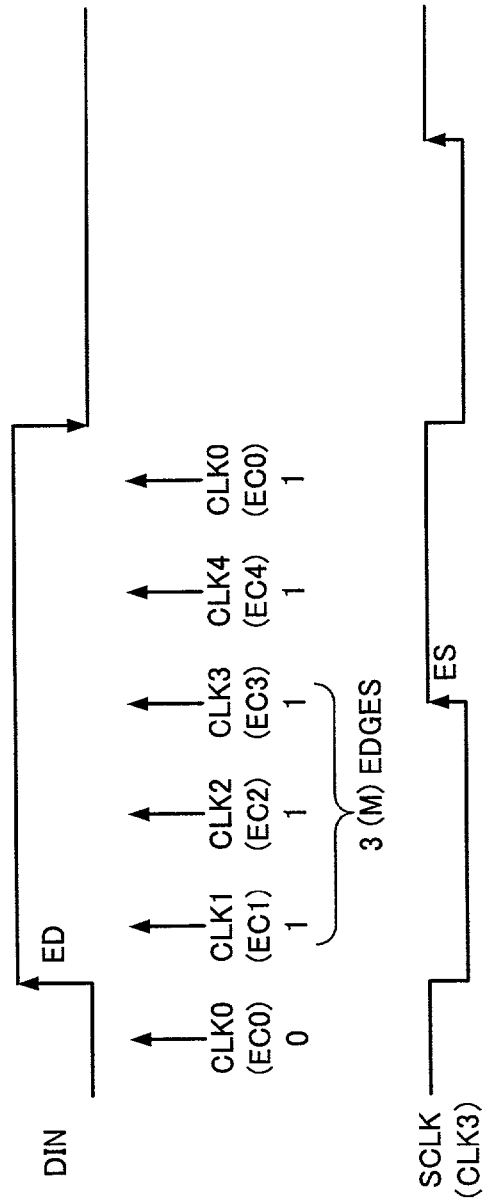
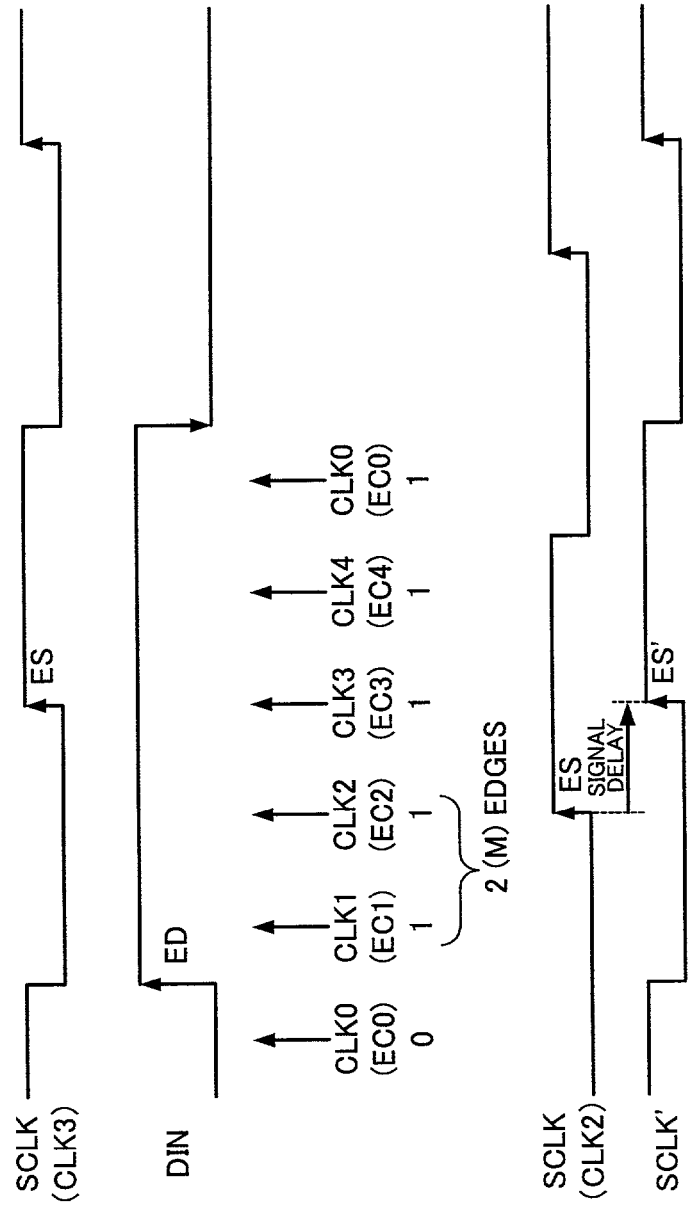
FIG. 24A
FIG. 24B

CLOCK GENERATION CIRCUIT, DATA TRANSFER CONTROL DEVICE, AND ELECTRONIC INSTRUMENT

Japanese Patent Application No. 2001-98349, filed on Mar. 30, 2001, and Japanese Patent Application No. 2000-319722, filed on Oct. 19, 2000, are hereby incorporated by reference in their entirety.

TECHNICAL FIELD

The present invention relates to a clock generation circuit, a data transfer control device, and an electronic instrument.

BACKGROUND

The universal serial bus (USB) standard has recently attracted attention as an interface standard for connections between personal computers and peripheral devices (generally speaking: electronic instruments). This USB standard has the advantage of enabling the use of connectors of the same standard to connect peripheral equipment such as a mouse, keyboard, and printer, which are connected by connectors of different standards in the prior art, and of making it possible to implement plug-and-play and hot-plug features.

In comparison with the IEEE 1394 standard which is also attracting notice as a standard for the same serial bus interface, this USB standard has a problem in that the transfer speed thereof is slower.

In this case, attention is being paid to the decision to use the USB 2.0 standard which can implement a data transfer speed of 480 Mbps (in HS mode), far faster than those of the previous USB 1.1 standard, while maintaining backward compatibility with USB 1.1. The USB 2.0 transceiver macrocell interface (UTMI), which defined interface specifications for the physical-layer and logical-layer circuitry under USB 2.0, has also been decided upon.

SUMMARY

According to an aspect of the present invention, there is provided a clock generation circuit comprising:

first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and first to Nth buffer circuits having inputs connected to outputs of the first to Nth inversion circuits, wherein the first to Nth inversion circuits are disposed along a first line that is parallel to the feedback line; and wherein the first to Nth buffer circuits are disposed along a second line that is parallel to the feedback line but different from the first line.

Another aspect of the present invention relates to a clock generation circuit comprising:

first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and first to Nth buffer circuits having inputs connected to outputs of the first to Nth inversion circuits, wherein first to (N−1)th dummy lines are connected to the corresponding outputs of the first to (N−1)th inversion circuits and each of the first to (N−1)th dummy lines has parasitic capacitance equal to the parasitic capacitance of the feedback line connected to the output of the Nth inversion circuit.

BRIEF DESCRIPTION OF THE DRAWINGS

FIG. 8A is illustrative of the method of disposing the inversion and buffer circuits in accordance with this embodiment and FIG. 8B is illustrative of the method of disposing the inversion and buffer circuits in accordance with a comparative example;

FIG. 19 shows an example of the configuration of the edge detection circuit and the clock selection circuit;

FIGS. 23A and 23B are further illustrative of the method of setting the number of clocks N;

FIGS. 24A and 24B are illustrative of the clock selection method (the method of setting M);

DETAILED DESCRIPTION

Figure 1:
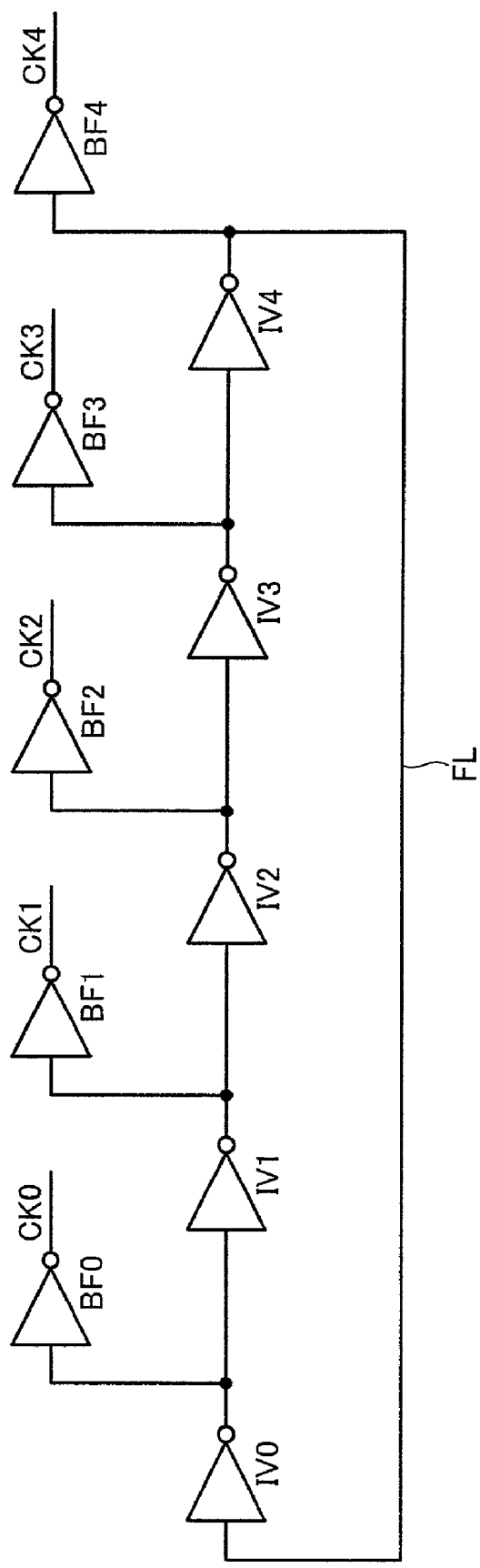
FIG. 1 shows an example of the configuration of a clock generation circuit in accordance with the embodiment.

Embodiments of the present invention are described below.

Note that the embodiments described below do not in any way limit the gist of the present invention laid out in the claims herein. In addition, all of the components in the configurations described for these embodiments are not the requirements the present invention.

Since data transfer in high-speed (HS) mode under USB 2.0 is at 480 Mbps, it has the advantage that it can be used as an interface for drives such as hard-disk drives or optical disk drives where rapid transfer speeds are required.

However, it is necessary to generate a high-frequency clock at 480 MHz for sampling the transfer data during the transfer of data in this HS mode. That gives rise to a technical problem in that it is not easy to design a clock generation circuit.

This embodiment was devised in the light of the above described technical problems and makes it possible to provide a clock generation circuit that generates a high-frequency clock with a simple circuit configuration, together with a data transfer control device and an electronic instrument using the same.

This embodiment of the present invention relates to a clock generation circuit comprising:

first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and first to Nth buffer circuits having inputs connected to outputs of the first to Nth inversion circuits, wherein the first to Nth inversion circuits are disposed along a first line that is parallel (including substantially parallel) to the feedback line; and wherein the first to Nth buffer circuits are disposed along a second line that is parallel (including substantially parallel) to the feedback line but different from the first line.

This embodiment of the invention makes it possible to configure an oscillation circuit and generate a clock of a given frequency, by inputting the output of the Nth (where N is an odd number) inversion circuit by a feedback line back to the input of the first inversion circuit. It is also possible to obtain multi-phase clock signals of the same frequency but different phases, by buffering the outputs of the first to Nth inversion circuits in the first to Nth buffer circuits.

With this embodiment, the first to Nth inversion circuits are disposed along a first line and the first to Nth buffer circuits are disposed along a second line that differs from the first line. This makes it possible to shorten the length of the feedback line, in comparison with a method wherein the first to Nth inversion circuits and the first to Nth buffer circuits are disposed along the same line. It therefore becomes possible to generate a high-frequency clock and also multi-phase clocks having equal phase differences.

With this embodiment, the feedback line may be disposed in a region between a region in which the first to Nth inversion circuits are disposed and a region in which the first to Nth buffer circuits are disposed.

Such a configuration makes it possible to substitute a line connecting the Nth inversion circuit and the Nth buffer circuit for the feedback line, thus preventing any addition of excess parasitic capacitance to the output of the Nth inversion circuit.

With this embodiment of the invention, the first to Nth inversion circuits may be differential-output type inversion circuits;

the first to Nth buffer circuits may be differential-input type buffer circuits to which are input differential outputs from the first to Nth inversion circuits;

the feedback line may include a feedback line pair connected to a differential output of the Nth inversion circuit; and the feedback line pair may be disposed in a region between a region in which the first to Nth inversion circuits are disposed and a region in which the first to Nth buffer circuits are disposed.

Such a configuration makes it possible to substitute a line pair connecting the Nth inversion circuit and the Nth buffer circuit for the feedback line pair, thus preventing any addition of excess parasitic capacitance to the output of the Nth inversion circuit.

With this embodiment, first to (N−1)th dummy lines may be connected to the corresponding outputs of the first to (N−1)th inversion circuits and each of the first to (N−1)th dummy lines has parasitic capacitance equal (including substantially equal) to the parasitic capacitance of the feedback line connected to the output of the Nth inversion circuit.

Such a configuration makes it possible to ensure that each of the parasitic capacitances of the outputs of the first to (N−1)th inversion circuits is equal (including substantially equal) to the parasitic capacitance of the output of the Nth inversion circuit, thus making it possible to generate multi-phase clocks with uniform phase differences.

With this embodiment, the feedback line and the first to (N−1)th dummy lines may be disposed in a region between a region in which the first to Nth inversion circuits are disposed and a region in which the first to Nth buffer circuits are disposed.

This makes it possible to facilitate the equalization of the parasitic capacitances of the outputs of the first to Nth inversion circuits.

With this embodiment, the first to Nth inversion circuits may be differential-output type inversion circuits;

the first to Nth buffer circuits may be differential-input type buffer circuits to which are input differential outputs from the first to Nth inversion circuits;

the feedback line may include a feedback line pair connected to a differential output of the Nth inversion circuit;

the first to (N−1)th dummy lines may include first to (N−1)th dummy line pairs connected to differential outputs of the first to (N−1)th inversion circuits; and the feedback line pair and the first to (N−1)th dummy line pairs may be disposed in a region between a region in which the first to Nth inversion circuits are disposed and a region in which the first to Nth buffer circuits are disposed.

Such a configuration facilitates the equalization of the parasitic capacitances of outputs of the differential-output type first to Nth inversion circuits.

This embodiment also relates to a clock generation circuit comprising:

first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and first to Nth buffer circuits having inputs connected to outputs of the first to Nth inversion circuits, wherein first to (N−1)th dummy lines are connected to the corresponding outputs of the first to (N−1)th inversion circuits and each of the first to (N−1)th dummy lines has parasitic capacitance equal (including substantially equal) to the parasitic capacitance of the feedback line connected to the output of the Nth inversion circuit.

This embodiment makes it possible to configure an oscillation circuit and generate a clock at a given frequency, by inputting the output of the Nth (where N is an odd number) inversion circuit to the input of the first inversion circuit by a feedback line. It is also possible to obtain multi-phase clock signals of the same frequency but different phases, by buffering the outputs of the first to Nth inversion circuits in the first to Nth buffer circuits.

With this embodiment, the outputs of the first to (N−1)th inversion circuits are connected to first to (N−1)th dummy lines in order to equalize the parasitic capacitances thereof. This ensures that the parasitic capacitances of the outputs of the first to (N−1)th inversion circuits are equal (including substantially equal) to the parasitic capacitance of the output of the Nth inversion circuit, making it possible to generate multi-phase clocks with uniform phase differences.

This embodiment may further comprise:

an edge detection circuit which detects between which two edges of first to Nth clocks a data edge is located, the first to Nth clocks being obtained on the basis of outputs of the first to Nth buffer circuits; and a clock selection circuit which selects one of the first to Nth clocks, based on edge detection information from the edge detection circuit, and outputs the selected clock as a sampling clock for sampling data.

This configuration makes it possible to detect between which two edges of the first to Nth multi-phase clocks a data edge is located. For example, it makes it possible to detect whether there is a data edge between the edges of the first and second clocks or between the edges of the second and third clocks. A clock is selected from the first to Nth clocks, based on the thus-obtained edge detection information (showing between which edges of the clocks a data edge is located), and that clock is output as the sampling clock.

The thus-configured embodiment makes it possible to generate a data sampling clock, with a simple configuration that selects a clock from first to Nth clocks, based on edge detection information. It is therefore possible to generate a sampling clock that is suitable for sampling data even when it is input in synchronization with a fast clock, using a compact circuit configuration.

With this embodiment, lines for the first to Nth clocks may be disposed in such a manner that the parasitic capacitances of the lines for the first to Nth clocks are equal (including substantially equal).

This configuration makes it possible to equalize the phase differences between the first to Nth clocks, making it possible to generate a suitable sampling clock.

With this embodiment, the edge detection circuit may have a first holding circuit which holds data by using a first clock, . . . a Jth holding circuit which holds data by using a Jth clock (where: $1<J<N$), . . . and an Nth holding circuit which holds data by using an Nth clock;

the first to Nth holding circuits may be disposed along a line parallel to the lines of the first to Nth clocks;

the lines of the first to Nth clocks may be connected to inputs of the first to Nth holding circuits, after being looped back in the opposite direction at first to Nth loop-back points; and the first to Nth loop-back points may be provided at positions such that the parasite capacitances of the lines of the first to Nth clocks are equal (including substantially equal).

Such a configuration makes it possible to equalize the parasitic capacitances of the lines of the first to Nth clocks, simply by setting the positions of the first to Nth loop-back points. The numbers of times the lines of the first to Nth clocks are looped back can also be made equal, making it possible to further reduce differences in parasitic capacitance in the lines of the first to Nth clocks.

With this embodiment, the edge detection circuit may comprise:

a first holding circuit which holds data by using a first clock, . . . a Jth holding circuit which holds data by using a Jth clock (where: $1<J<N$), . . . and an Nth holding circuit which holds data by using an Nth clock; and a first detection circuit which detects whether or not there is a data edge between the edges of the first clock and a second clock, based on data held in the first holding circuit and a second holding circuit, . . . a Jth detection circuit which detects whether or not there is a data edge between the edges of the Jth clock and a (J+1)th clock, based on data held in the Jth holding circuit and a (J+1)th holding circuit, . . . and an Nth detection circuit which detects whether or not there is a data edge between the edges of the Nth clock and the first clock, based on data held in the Nth holding circuit and the first holding circuit; and wherein the clock selection circuit may select a clock from among the first to Nth clocks, based on edge detection information from the first to Nth detection circuits, and output the selected clock as the sampling clock.

Such a configuration makes it possible to detect between which two edges of the clocks a data edge is located, with a simple configuration that is merely provided with the first to Nth holding circuits and the first to Nth detection circuits.

With this embodiment, when a set-up time of the first to Nth holding circuits is TS, a hold time of the first to Nth holding circuits is TH, and a period of each of the first to Nth clocks is T, the number of clocks N of the first to Nth clocks may be given by: $N \leq [T/(TS+TH)]$ (where [X] is the maximum integer that does not exceed X).

This makes it possible to obtain suitable edge detection information, even when the data held in the first to Nth holding circuits is undefined.

With this embodiment, the number of clocks N may be defined by $N=[T/(TS+TH)]$ (where [X] is the maximum integer that does not exceed X).

This enables maximization of the number of clocks N, within a range of N that makes it possible to obtain suitable edge detection information, thus broadening the range for selecting a clock by the clock selection circuit.

With this embodiment, the number of clocks N of the first to Nth clocks may be such that N=5.

If N is set to five in this manner, it is possible to select a clock that has an edge that is shifted by 2 to 4 edges from the data edge, as the sampling clock, thus broadening the range for selecting a clock. In addition, if the first to Nth (where N=5) clocks are obtained from outputs of inversion circuits included in oscillation circuits in phase-locked loop (PLL) circuits, it is possible for the oscillation circuits in PLL circuits to oscillate at a high frequency. This makes it possible to obtain a high-frequency sampling clock.

With this embodiment, the clock selection circuit may select a clock having an edge that is shifted by a given set number M of edges from a data edge, from among the first to Nth clocks, and output the selected clock as the sampling clock.

Such a configuration makes it possible to provide a sampling clock that is suitable to the configuration of that later-stage circuit, even when the later-stage circuit samples data without directly using the sampling clock generated by the clock generation circuit.

With this embodiment, the number M may be set to a number that ensures set-up and hold times of a circuit which holds data based on the generated sampling clock.

Such a configuration makes it possible to improve reliability by preventing data sampling errors in later-stage circuits.

This embodiment could also relate to a data transfer control device for transferring data over a bus, the data transfer control device comprising:

any of the above described clock generation circuits; and a circuit which holds data based on a sampling clock generated by the clock generation circuit, and performs given processing for data transfer, based on the held data.

This embodiment makes it possible to generate a sampling clock that enables reliable sampling of data transferred over a bus, thus enabling an increase in the reliability of the data transfer. Since data that is transferred at a high transfer speed can thus be sampled reliably, it becomes possible to implement a data transfer control device that can accommodate a high-speed bus standard.

With this embodiment invention, data transfer may be in accordance with the universal serial bus (USB) standard.

Such a configuration makes it possible to implement even data transfer in the HS mode that has been standardized by USB 2.0, by way of example.

An Electronic instrument in accordance with this embodiment of the present invention comprises:

any of the above described data transfer control devices; and a device which performs output processing, fetch processing or storage processing on data transferred through the data transfer control device and the bus.

This embodiment makes it possible to reduce the cost and increase the reliability of the data transfer control device used in the electronic instrument, thus making it possible to reduce the cost and increase the reliability of the electronic instrument itself. Since it also makes facilitates data transfer in fast transfer mode, it leads to an increase of the speed of processing of the electronic instrument.

The above embodiments are described below in detail with reference to the accompanying drawings.

1. Clock Generation Circuit 1.1 Configuration of Clock Generation Circuit

An example of the configuration of a clock generation circuit in accordance with the present invention is shown in FIG. 1.

This clock generation circuit comprises inversion circuits IV0 to IV4 and buffer circuits BF0 to BF4.

In this case, the inversion circuits IV0 to IV4 are connected in such a manner that the output of each previous-stage inversion circuit is connected to the input of the next-stage inversion circuit, and also the output of the final-stage inversion circuit IV4 is input to the first inversion circuit IV0 by a feedback line FL (feedback wire). In this manner, it is possible to configure an oscillation circuit that generates a clock of a frequency that corresponds to the signal delay of the inversion circuits, by connecting an odd number (N) of inversion circuits in series and also feeding back the output of the final-stage inversion circuit to the first inversion circuit.

The outputs of the inversion circuits IV0 to IV4 of FIG. 1 are also connected to the inputs of the corresponding buffer circuits BF0 to BF4. The provision of these buffer circuits BF0 to BF4 make it possible to use outputs CK0 to CK4 of the buffer circuits BF0 to BF4 as clocks (clocks of the same frequency but different phases).

Note that the number of inversion circuits in FIG. 1 is five (N=5), but this number could be less than five or greater than five.

Various different configurations can be used for the inversion circuits, such as single-input/single-output type inversion circuits or differential-input/differential-output type inversion circuits, provided that they at least output a signal of the opposite phase to the input thereof.

In addition, various different configurations could be adopted for the buffer circuits, such as single-input/single-(end)-output type buffer circuits, differential-input/differential-output type buffer circuits, or differential-input/single-output type buffer circuits, provided the buffer circuits at least buffer the outputs of the inversion circuits (by either inverted buffering or non-inverted buffering).

If the clock generation circuit of FIG. 1 is used as a voltage-controlled oscillator (VCO) in a phase-locked loop (PLL), it becomes possible to employ inversion circuits of a configuration such that signal delay is controlled by voltage (or current).

1.2 Layout of Clock Generation Circuit

Figure 2A:
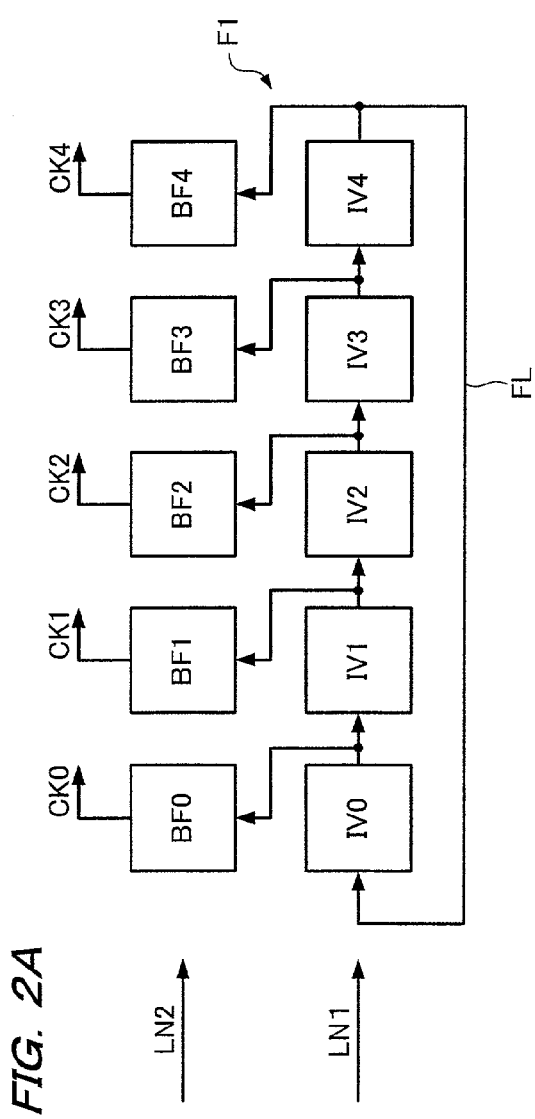
FIG. 2A is illustrative of the method of disposing the inversion and buffer circuits in accordance with this embodiment and FIG. 2B is illustrative of the method of disposing the inversion and buffer circuits in accordance with a comparative example.

The layout of the clock generation circuit of this embodiment of the invention, described with reference to FIG. 1, is shown in FIG. 2A.

In other words, the inversion circuits IV0 to IV4 (circuit pattern and circuit layout) are disposed along a line LN1 (first line) that is parallel to the feedback line FL, as shown in FIG. 2A. The buffer circuits BF0 to BF4 are disposed along a line LN2 that is also parallel to the feedback line FL but is different from LN1. That is to say, the buffer circuits BF0 to BF4 are disposed on an upper side (or lower side) of the inversion circuits IV0 to IV4 disposed along the line LN1. This arrangement makes it possible to shorten the length of the feedback line FL and thus reduce the parasitic capacitance of the feedback line FL. It thus becomes possible to increase the oscillation frequency of the clock generation circuit, making it possible to obtain a high-frequency clock.

Figure 2B:
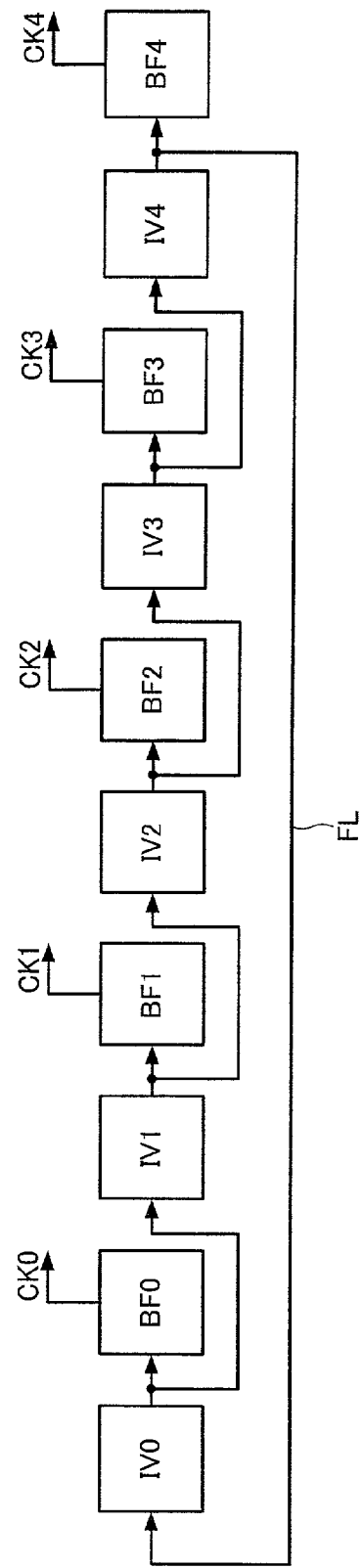

A method of disposition (layout method) in accordance with a comparative example is shown in FIG. 2B, by way of example. In FIG. 2B, the disposition is such that the buffer circuit BF0 is adjacent to the inversion circuit IV0, the inversion circuit IV1 is adjacent thereto, and the buffer circuit BF1 is further adjacent threreto. In other words, the inversion circuits IV0 to IV4 and the buffer circuits BF0 to BF4 are disposed along the same line.

It is clear from FIG. 2B that this disposition method lengthens the feedback line FL beyond that shown in FIG. 2A, thus increasing the parasitic capacitance in FL (by approximately twice, by way of example). This method causes a technical problem in that it is more difficult to obtain a high-frequency clock, in comparison with the method of FIG. 2A.

This embodiment of the present invention makes it possible to increase the oscillation frequency of the clock generation circuit by adjusting the circuit layout as shown in FIG. 2A, even with the same circuit configuration. This facilitates the generation of the high-frequency (480 MHz) clock required for standards such as USB 2.0. More specifically, it becomes possible to use the outputs CK0 to CK4 of the buffer circuits BF0 to BF4 (multi-phase clocks of the same frequency but different phases) and thus generate a sampling clock for sampling 480-Mbps transfer data.

It is particularly desirable that the phase differences (signal delay differences) between the multi-phase clocks used in the generation of the sampling clock are as uniform as possible.

With the disposition method of FIG. 2B, however, the feedback line FL is longer which means that the parasitic capacitance in the output of the inversion circuit IV4 is greater than those of the other inversion circuits IV0 to IV3. This therefore creates a discrepancy in the phase differences between the clocks.

In contrast thereto, the disposition method of this embodiment that is shown in FIG. 2A reduces the parasitic capacitance in the feedback line FL, thus making it possible to make the phase differences between the clock more uniform than with the configuration of FIG. 2B.

It is possible that a high-frequency clock of 480 MHz could be generated without any particular contrivance in the disposition method, by using the latest semiconductor processes that enable microprocessing.

However, when it comes to incorporating the clock generation circuit in a macrocell or an application specific integrated circuit (ASIC), it is desirable to use ordinary semiconductor processing instead of the latest semiconductor processing. It would also be impossible to use the latest semiconductor processes that enable microprocessing in integrated circuit devices that mix analog and digital circuits, because of problems with the withstand voltages of the circuit elements.

The disposition method of this embodiment shown in FIG. 2A makes it possible to generate a high-frequency clock and reduce the fabrication costs, even when the latest semiconductor processing is used.

1.3 Feedback Line Disposition

In FIG. 2A, the feedback line FL is shown disposed below the inversion circuits IV0 to IV4.

Figure 3:
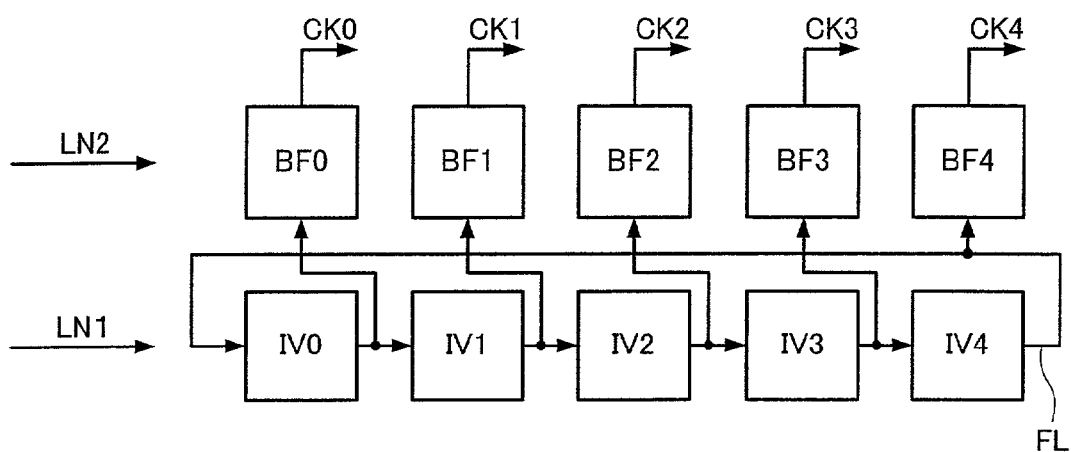
FIG. 3 is illustrative of a method of disposing a feedback line in a region between the inversion circuits and the buffer circuits.

However, it is desirable to dispose the feedback line FL in a region between a region in which the inversion circuits IV0 to IV4 are disposed (the region along the line LN1) and the region in which the buffer circuits BF0 to BF4 are disposed (the region along the line LN2), as shown in FIG. 3.

In other words, it is necessary to connect the output of the final-stage inversion circuit IV4 to the final-stage buffer circuit BF4. It is therefore necessary for the wiring for the connection to run as shown at F1 in FIG. 2A. For that reason, the method of disposition shown in FIG. 2A, where the feedback line FL is disposed below the inversion circuits IV0 to IV4, adds an excess of parasitic capacitance equivalent to the line denoted by F1 to the feedback line FL.

In contrast thereto, use of the method of disposing the feedback line FL in the region between the inversion circuits IV0 to IV4 and buffer circuits BF0 to BF4, as shown in FIG. 3, makes it possible to substitute the line denoted by F1 in FIG. 2A with the feedback line FL. It is therefore possible to reduce the parasitic capacitance in the output of the inversion circuit IV4 by an amount equivalent to the line denoted by F1. This ensures that a clock of a higher frequency can be generated and also the phase differences between the multi-phase clocks CK0 to CK4 can be made more even.

The disposition method of FIG. 3 also enables the disposition of dummy lines in the region in which the feedback line FL is disposed, as will be described later. This makes it possible to equalize the parasitic capacitances of the outputs of the inversion circuits IV0 to IV4, enabling further equalization of the phase differences between the multi-phase clocks CK0 to CK4.

1.4 Dummy Lines

It can be seen from FIG. 3 that the feedback line FL connected to the output of the inversion circuit IV4 is longer than the lines connected to the outputs of the inversion circuits IV0 to IV3 (the lines between IV0 to IV3 and BP0 and PF3). For that reason, the parasitic capacitance of the output from the inversion circuit IV4 is greater than the parasitic capacitances of the outputs of the other inversion circuits IV0 to IV3, making the phase differences between the clocks CL0 and CL4 non-uniform by that amount. If the phase differences become uneven, the difference between clocks with the smallest phase difference (difference between signal delays) becomes a critical path, and a situation arises in which it is not possible to ensure the set-up and hold times of the D flip-flops (holding circuits).

Figure 4:
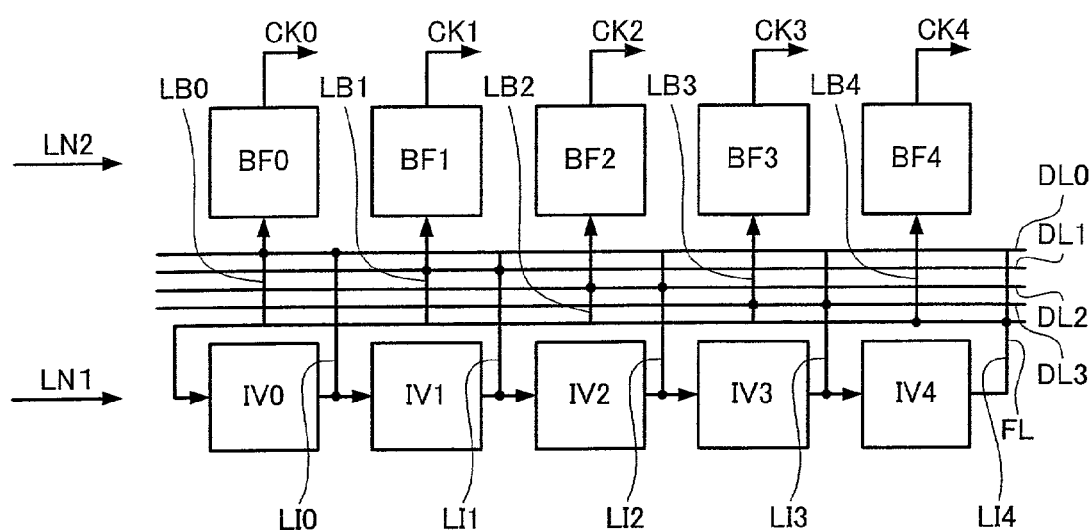
FIG. 4 is illustrative of a method of disposing a feedback line and dummy lines in a region between the inversion circuits and the buffer circuits.

With embodiment of the present invention, the outputs of the inversion circuits IV0 to IV3 are provided with dummy lines DL0 to DL3 having parasitic capacitances each of which is equal (equivalent) to the parasitic capacitance of the feedback line FL connected to the output of the final-stage inversion circuit IV4, as shown in FIG. 4. More specifically, dummy lines DL0 to DL3 of substantially the same length (and same width) as the feedback line FL are disposed parallel to the feedback line FL.

Connecting these dummy lines DL0 to DL3 to the inversion circuits IV0 to IV3 ensures that the parasitic capacitances (wiring capacitances) of the outputs of the inversion circuits IV0 to IV3 can be made equivalent to the parasitic capacitance of the output of the inversion circuit IV4. This ensures that phase differences between the multi-phase clocks CK0 to CK4 can be equalized and thus makes it possible to generate clocks CK0 to CK4 of substantially the same phase difference (signal delay difference) which are sequentially shifted. As a result, these clocks CK0 to CK4 can be used to ensure the maximum values of set-up and hold times for the D flip-flops during the generation of the data sampling clock. It therefore becomes possible to prevent the generation of data sampling and hold errors, thus making it possible to generate a clock that is suitable for data sampling.

Note that lines LI0 to LI4 used for connecting the inversion circuits IV0 to IV4 to the dummy lines DL0 to DL3 and the feedback line FL in FIG. 4 are of the same length. In other words, the line LI1, for example, is extended beyond a connection point (contact) thereof with the dummy line DL1, in FIG. 4. Similarly, the lines LI2, LI3, and LI4 are extended beyond the respective connection points with DL2, DL3, and FL.

Similarly, lines LB0 to LB4 used for connecting the dummy lines DL0 to DL3 and the feedback line FL to the buffer circuits BF0 to BF4 in FIG. 4 are of the same length. In other words, the lines LB0, LB1, LB2, and LB3 are extended beyond the respective connection points with DL0, DL1, DL2 and DL3 in FIG. 4.

By extending the wiring of the lines LI0 to LI4 and LB0 to LB4 by excess portions in this manner, it is possible to equalize the parasitic capacitances of the outputs of the inversion circuits IV0 to IV4 and thus generate clocks CK0 to CK4 having more uniform phase differences.

In addition, the feedback line FL and the dummy lines DL0 to DL3 are disposed in a region between the region in which the inversion circuits IV0 to IV4 are disposed and the region in which the buffer circuits BF0 to BF4 are disposed, as shown in FIG. 4. This facilitates the equalization of the lengths of the connection lines LI0 to LI4 between the inversion circuits IV0 to IV4 and the dummy lines DL0 to DL3 plus the feedback line FL, and also the equalization of the lengths of the connection lines LB0 to LB4 between the dummy lines DL0 to DL3 plus the feedback line FL and the buffer circuits BF0 to BF4.

In other words, the parallel lines DL0 to DL3 and FL are disposed between the inversion circuits IV0 to IV4 and the buffer circuits BF0 to BF4, and the lines LI0 to LI4 and LB0 to LB4 are also provided, as shown in FIG. 4. This configuration makes it possible to provide appropriate connections between the inversion circuits IV0 to IV4 and the buffer circuits BF0 to BF4, by simply disposing contacts at the positions where the connection points between the lines are to go, and also makes it possible to equalize the parasitic capacitances of the outputs of IV0 to IV4.

In the example shown in FIG. 4, each buffer circuit is disposed on the upper side of the corresponding inversion circuit (the inversion circuit having an output that is input to that buffer circuit). In other words, BF0 is above IV0, BF1 is above IV1, BF2 is above IV2, BF3 is above IV3, and BF4 is above IV4.

However, it is not always necessary to dispose the buffer circuits above the corresponding inversion circuits in the configuration shown in FIG. 4 in which the dummy lines are provided in the region between the inversion circuits and the buffer circuits.

Figure 5:
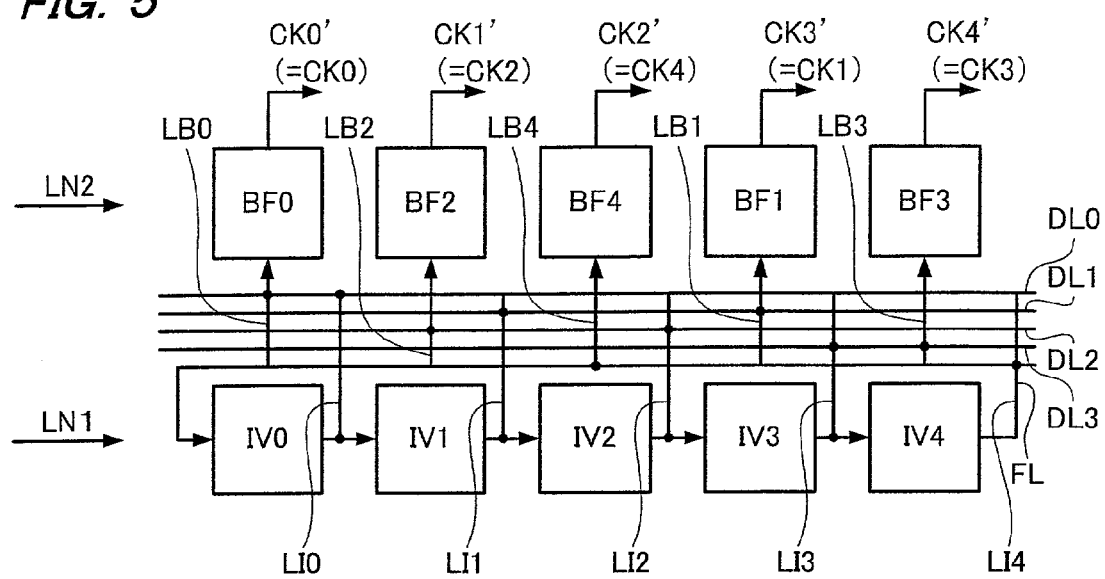
FIG. 5 is illustrative of a method of switching the dispositions of the buffer circuits.

For example, the connection points between the lines LI0 to LI4 and the lines DL0 to 3 plus FL and the connection points between the lines LB0 to LB4 and the lines DL0 to 3 plus FL could equally well be disposed in a manner different from that shown in FIG. 4, such as the sequence of buffer circuits shown in FIG. 5 (BF0, BF2, BF4, BF1, then BF3).

Use of the outputs of buffer circuits that are disposed as shown in FIG. 5 makes it possible to generate clocks CK0' to CK4' with rising (or falling) edges that have the same phase difference (signal delay difference) but are sequentially shifted.

Figure 6A:
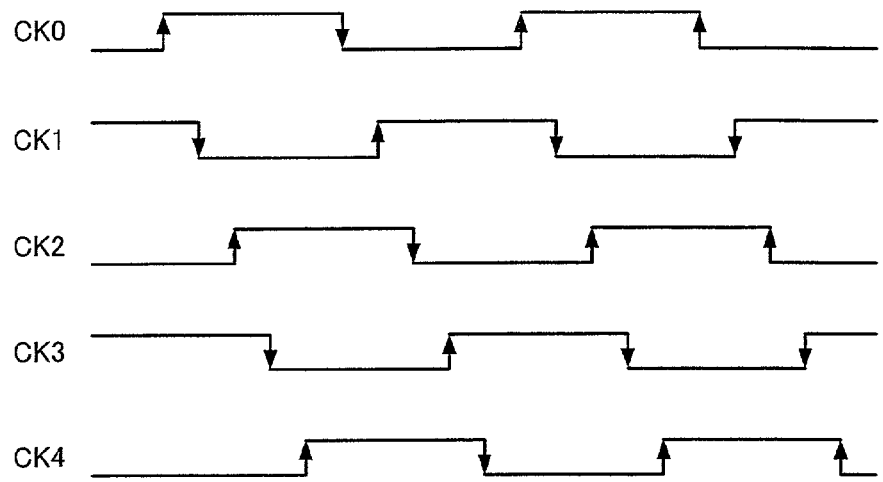
FIGS. 6A and 6B are timing waveform charts illustrating the method of switching the dispositions of the buffer circuits.

With the clocks CK0 to CK4 obtained by disposing the buffer circuits as shown in FIG. 4, by way of example, the fall of CK1 comes after the rise of CK0, as shown in FIG. 6A. If the clock period is T, the phase difference between the rise of CK0 and the rise of CK1 is T/10 (generally speaking: T/2N).

Figure 6B:
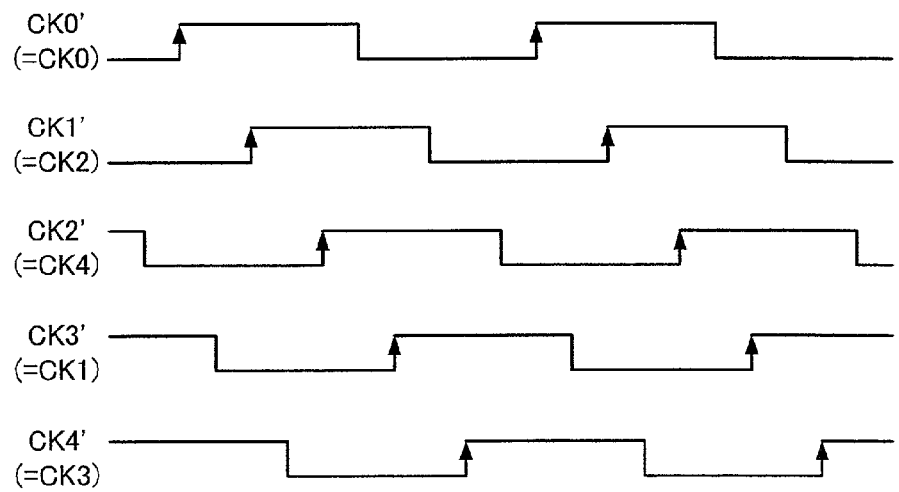

In contrast thereto, the clocks CK0' to CK4' obtained by disposing the buffer circuits as shown in FIG. 5 provide rising (or falling) edges that have the same phase difference but shifted sequentially, as shown in FIG. 6B. The phase difference between the clocks is T/5 (generally speaking: T/N). It is therefore possible to obtain multi-phase clocks CK0' to CK4' that are optimal for generating the sampling clock, as will be described later.

If the configuration is such that the dummy lines and the feedback line are disposed in the region between the inversion circuits and the buffer circuits, that region can be utilized for switching the connections between the inversion circuits, buffer circuits, dummy lines, and the feedback line, thus making it possible to obtain multi-phase clocks that are optimal for generating the sampling clock.

1.5 Differential Type Inversion Circuits

In the clock generation circuit of FIG. 1, the inversion circuits IV0 to IV4 and the buffer circuits BF0 to BF4 are single-input/single-output type circuits. However, it is also possible to use differential-input/differential-output type circuits as the inversion circuits DCP0 to DCP4 and differential-input/single-output (or differential-input/differential-output) type circuits as the circuits SCP0 to SCP4, as shown in FIG. 7.

Figure 7:
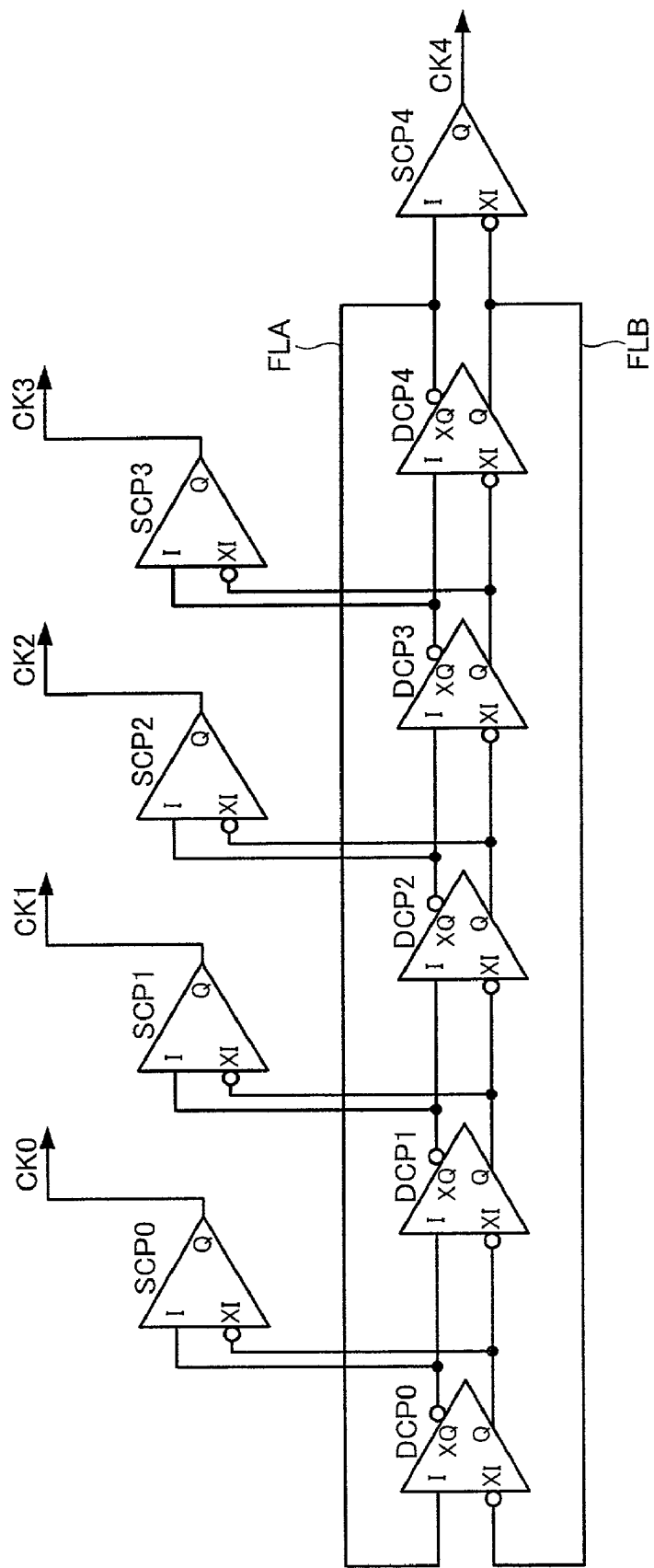
FIG. 7 shows another example of the configuration of the clock generation circuit.

More specifically, the differential outputs of the inversion circuits DCP0 to DCP3 of FIG. 7 are connected to the differential inputs of the next-stage circuits DCP1 to DCP4, and also the differential outputs of DCP4 are connected to the differential inputs of DCP0 by a feedback line pair FLA and FLB. The differential outputs of the inversion circuits DCP0 to DCP4 are also connected to the differential inputs of the corresponding buffer circuits SCP0 to SCP4. The outputs of the buffer circuits SCP0 to SCP4 are output as the multi-phase clocks CK0 to CK3.

Even with the clock generation circuit of the configuration shown in FIG. 7, it is desirable to dispose the components as shown in FIG. 8A.

In other words, the inversion circuits DCP0 to DCP4 of FIG. 8A are disposed along a line LN1 that is parallel to the feedback line pair FLA and FLB and the buffer circuits SCP0 to SCP4 are disposed along a line LN2 that is parallel to FLA and FLB but different from LN1. This makes it possible to shorten the lengths of the feedback line pair FLA and FLB, in comparison with a comparative example shown in FIG. 8B, thus reducing the parasitic capacitances thereof. As a result, a high-frequency clock can be generated easily. It is also possible to equalize the phase differences between the multi-phase clocks, thus making it possible to generate multi-phase clocks that are optimal for generating a sampling clock.

Figure 9:
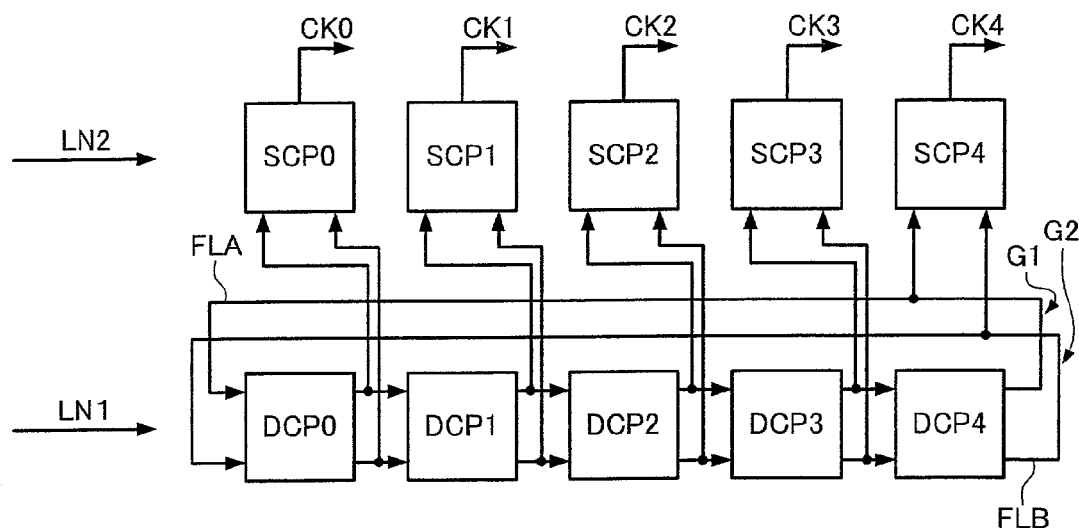
FIG. 9 is illustrative of a method of disposing a feedback line pair in the region between the inversion circuits and the buffer circuits.

Even when differential type inversion circuits such as those shown in FIG. 7 are used, it is desirable to dispose the feedback line pair FLA and FLB in the region between the inversion circuits DCP0 to DCP4 and the buffer circuits SCP0 to SCP4, as shown in FIG. 9. This configuration makes it possible to substitute the line portions denoted by G1 and G2, for connecting the inversion circuits and buffer circuits, for the feedback line pair FLA and FLB, thus preventing the addition of excess parasitic capacitance to the output of the inversion circuit DCP4. As a result, it is possible to generate a high-frequency clock and also equalize the phase differences between the multi-phase clocks CK0 to CK4.

Figure 10:
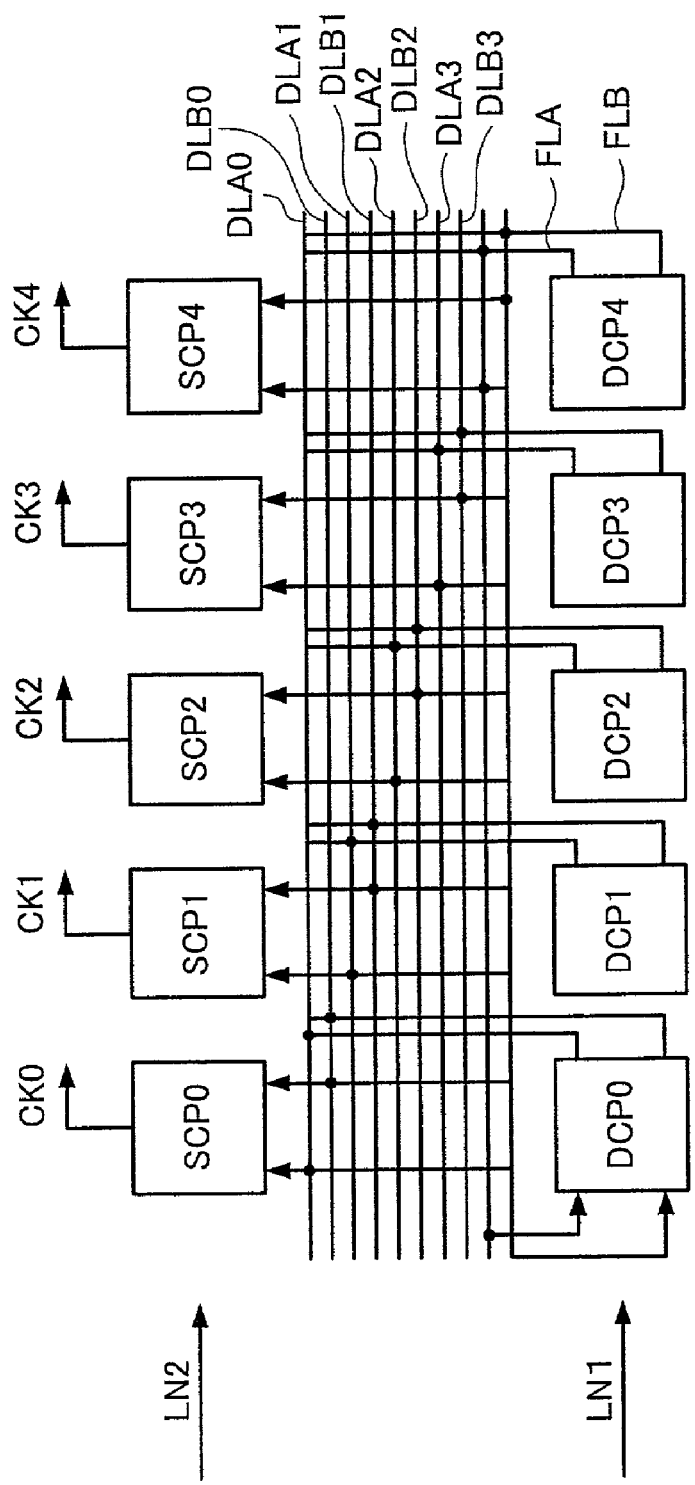
FIG. 10 is illustrative of a method of disposing a feedback line pair and dummy line pairs in the region between the inversion circuits and the buffer circuits.

It is also desirable to provide dummy line pairs DLA0 to DLA3 and DLB0 to DLB3 as shown in FIG. 10, even when the differential type inversion circuits of FIG. 7 are used. It is further desirable to dispose the dummy line pairs DLA0 to DLA3 and DLB0 to DLB3 and the feedback line pair FLA and FLB in the region between the inversion circuits DCP0 to DCP4 and the buffer circuits SCP0 to SCP4.

Such a configuration makes it possible to equalize the parasitic capacitances of the outputs of the inversion circuits DCP0 to DCP4, thus equalizing the phase differences between the multi-phase clocks CK0 to CK4 and generating clocks CK0 to CK4 that have substantially the same phase difference (signal delay difference), but shifted sequentially.

If the circuit pattern (layout pattern) of the circuitry were to be laid out according to the circuit image as shown in FIG. 7, FLA would be disposed above the inversion circuits DCP0 to DCP4 and FLB would be disposed therebelow, so an excess parasitic capacitance would be added to the feedback line pair FLA and FLB, as mentioned previously. This would not make it easy to provide the dummy line pair and dispose the dummy line pair and the feedback line pairs in the region between the inversion circuits and the buffer circuits.

With this embodiment, the generation of a high-frequency clock and the generation of multi-phase clocks with uniform phase differences can be achieved by disposing the inversion circuits, the buffer circuits, and the feedback line pair in a circuit pattern that differs from the direct circuit image shown in FIG. 7.

2. Application to USB 2.0

The description now turns to the application of the above described clock generation circuit to a data transfer control device in accordance with USB 2.0.

2.1 Data Transfer Control Device

Figure 11:
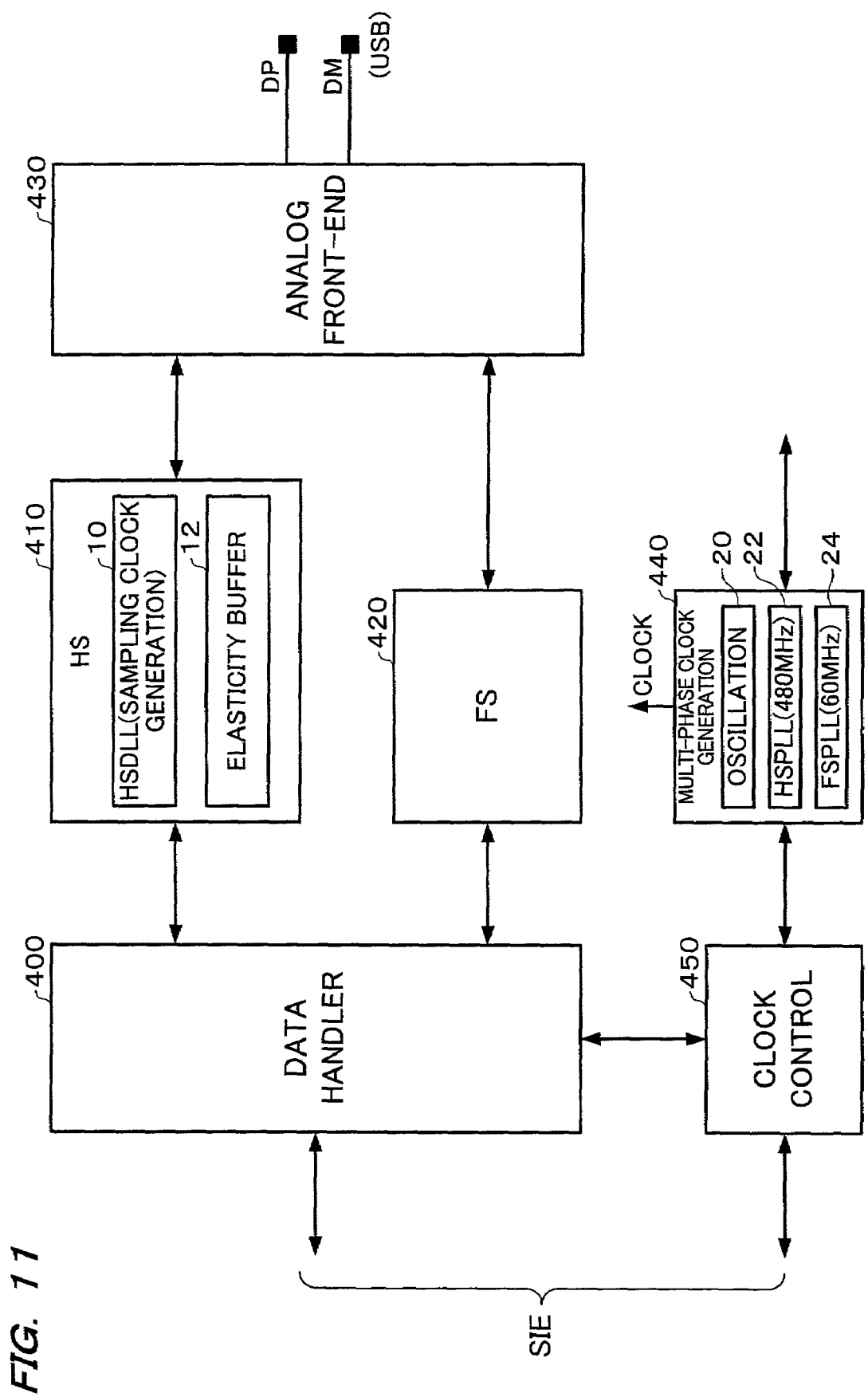
FIG. 11 shows an example of the configuration of a data transfer control device in accordance with this embodiment of the present invention.

An example of the configuration of a data transfer control device in accordance with this embodiment is shown in FIG. 11.

The data transfer control device of this embodiment comprises a data handler circuit 400, a high-speed (HS) circuit 410, a full-speed (FS) circuit 420, an analog front-end circuit 430, multi-phase clock generation circuit 440, and a clock control circuit 450. Note that not all of the circuit blocks shown in FIG. 11 are necessary for the data transfer control device of the present invention; some of them may be omitted.

The data handler circuit 400 (generally speaking: a given circuit for performing data transfer) performs various types of processing for transferring data in conformation with a standard such as USB. More specifically, during transmission, it performs processing such as attaching synchronization (SYNC), start of packet (SOP), and end of packet (EOP) codes to the data to be transmitted, and bit stuffing. During reception, on the other hand, it performs processing to detect and remove the SYNC, SOP, and EOP codes, and bit unstuffing. In addition is generates various timing signals for controlling the data transfer.

Note that received data is output to a serial interface engine (SIE) that is a stage after the data handler circuit 400, and data to be transmitted is input to the data handler circuit 400 from the SIE.

The HS circuit 410 is a logic circuit for transferring data at high speed (HS), which is a data transfer speed of 480 Mbps, and the FS circuit 420 is a logic circuit for transferring data at a full speed (FS), which is a data transfer speed of 12 Mbps.

In this case, HS mode is a new transfer mode that has been defined by USB 2.0. FS mode, on the other hand, is a transfer mode that was defined previously by the USB 1.1.

Since USB 2.0 provides this HS mode, it makes it possible to implement not only data transfer for devices such as printers, audio equipment, and cameras, but also data transfer in storage devices such as hard disk drives or optical disk (CD-ROM or DVD) drives.

The HS circuit 410 comprises a high-speed delay line PLL (HSDLL) circuit 10 and an elasticity buffer 12.

In this case, the HSDLL circuit 10 (sampling clock generation circuit) is a circuit that generates a data sampling clock based on received data and a clock from the multi-phase clock generation circuit 440 (HSPLL).

The elasticity buffer 12 is a circuit for absorbing any difference in clock frequency (clock drift) between the internal device (the data transfer control device) and an external device (an external device connected to the bus).

The analog front-end circuit 430 is an analog circuit comprising drivers and receivers for transfer at FS and HS. With USB, data is transferred by a differential signal, using data-plus (DP) and data-minus (DM) signals.

The multi-phase clock generation circuit 440 generates a 480-MHz clock used within the device and a 60-MHz clock used within the device and by the SIE.

The multi-phase clock generation circuit 440 comprises an oscillation circuit 20, an HS phase-locked loop (HSPLL) 22, and an FS phase-locked loop (FSPLL) 24.

In this case, the oscillation circuit 20 generates a base clock in combination with a component such as an external oscillator, by way of example.

The HSPLL 22 is a PLL that generates the 480-MHz clock necessary for HS mode as well as the 60-MHz clock necessary for FS mode, various components within the device, and the SIE, based on the base clock generated by the oscillation circuit 20. Note that when transfer is in HS mode, it is necessary to validate clock generation by the HSPLL 22.

The FSPLL 24 generates the 60-MHz clock necessary for FS mode, various components within the device, and the SIE, based on the base clock generated by the oscillation circuit 20. Note that transfer in HS mode is not possible when clock generation by this FSPLL 24 is enabled.

The clock control circuit 450 receives various control signals from the SIE and performs processing such as control of the multi-phase clock generation circuit 440.

2.2 Sampling Clock Generation Circuit

Figure 12:
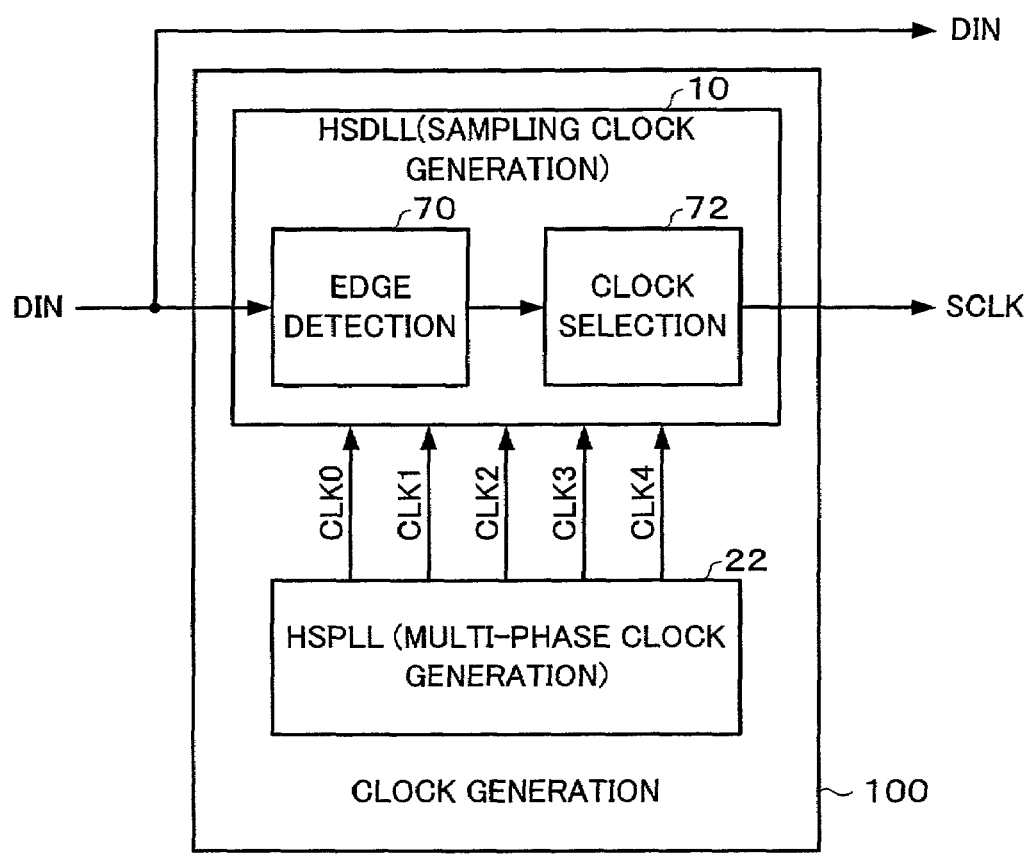
FIG. 12 shows an example of the configuration of the sampling clock generation circuit in accordance with this embodiment of the invention.

An example of the configuration of a clock generation circuit 100 wherein this embodiment is applied to USB 2.0 is shown in FIG. 12. This clock generation circuit 100 comprises the HSDLL circuit 10 (sampling clock generation circuit) and the HSPLL 22 (multi-phase clock generation circuit).

In this case, the HSPLL 22 outputs clocks CLK0, CLK1, CLK2, CLK3, and CLK4 (generally speaking: first to Nth clocks) of the same frequency but with mutually different phases. More specifically, it uses the outputs of inversion circuits (first to Nth inversion circuits in an odd number of stages) included in the VCO (an oscillation circuit with variably controlled oscillation frequency) of the HSPLL 22, to generate and output the clocks CLK0 to CLK4.

The HSDLL circuit 10 comprises an edge detection circuit 70 and a clock selection circuit 72. This edge detection circuit 70 detects an edge of data DIN, which is input from the analog front-end circuit 430, and outputs that edge detection information to the clock selection circuit 72.

More specifically, it detects whether there is an edge of data DIN between any of either the rising or falling edges of CLK0 to CLK4 from the HSPLL 22, and outputs that edge detection information to the clock selection circuit 72.

When that happens, the clock selection circuit 72 selects one of the clocks CLK0 to CLK4 based on that edge detection information, then outputs the selected clock to the elasticity buffer 12 (see FIG. 11) in a later stage as a sampling clock SCLK.

Figure 13A:
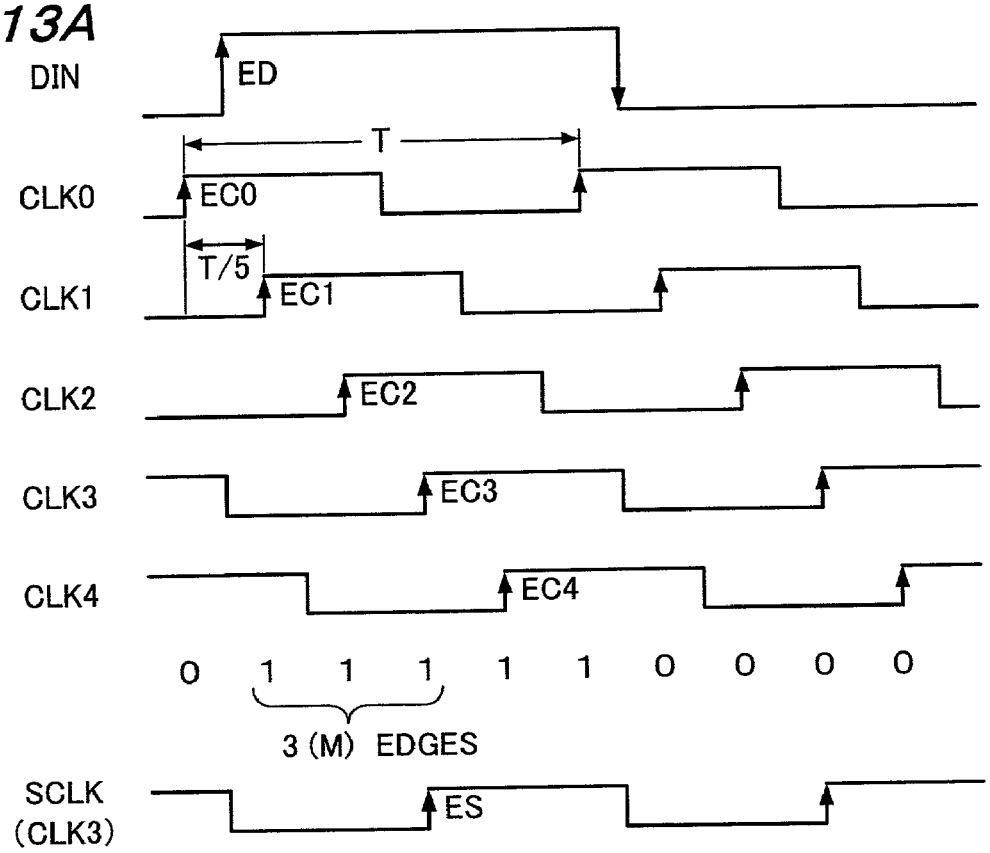
FIGS. 13A and 13B are timing waveform charts illustrating the operation of this embodiment.
Figure 13B:
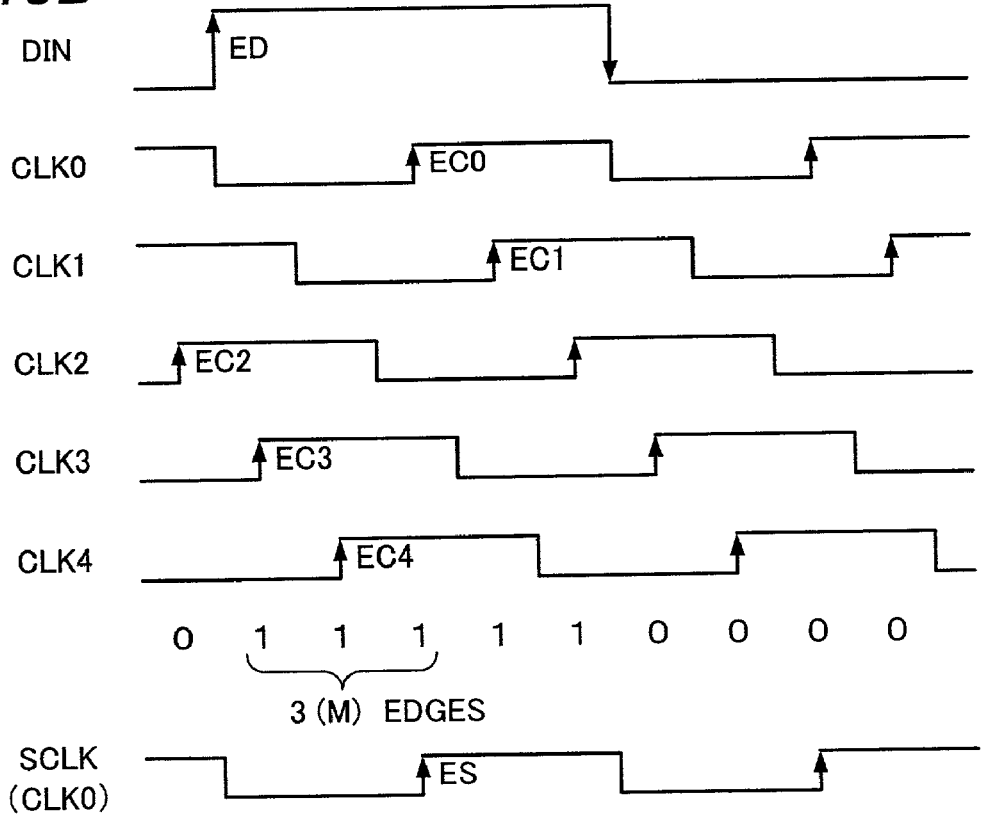

Timing waveform charts shown in FIGS. 13A and 13B illustrate the operation of this embodiment of the present invention.

As shown in FIGS. 13A, and 13B, CLK0 to CLK4 are clocks at the same frequency of 480 MHz. If the period of each clock is T, the phase between each pair of clocks is shifted by T/5 (generally speaking: T/N).

FIG. 13A shows an example in which an edge ED of the data DIN that is being sampled is detected by the edge detection circuit 70 of FIG. 12 between the clocks CLK0 and CLK1. If that happens, the clock CLK3, which has an edge EC3 that is shifted by just three edges (generally speaking: a set number M of edges) from the edge ED of the data DIN, is selected by the clock selection circuit 72 of FIG. 12, and the thus-selected CLK3 is output to the later-stage circuit (the elasticity buffer 12) as the DIN sampling clock SCLK.

In FIG. 13B, on the other hand, the edge ED of DIN is detected by the edge detection circuit 70 between CLK2 and CLK3. If that happens, the clock CLK0 having an edge EC0 that is shifted by just three edges (generally speaking: the set number M of edges) from the edge ED of DIN is selected by the clock selection circuit 72, by way of example, and the thus-selected CLK0 is output to the later-stage circuit (the elasticity buffer 12) as the DIN sampling clock SCLK.

This embodiment therefore provides a simple configuration that makes it possible to detect the edge ED of the data DIN and generate the sampling clock SCLK for the data DIN by selecting from CLK0 to CLK4, based on the thus-obtained edge detection information. It is therefore possible to generate a clock SCLK that is suitable for sampling DIN, even when DIN is fast transfer data that is synchronized with the 480 MHz of an external device.

This embodiment makes it possible to position an edge ES of the generated sampling clock SCLK close to the direct center of the edges of DIN, as shown in FIGS. 13A and 13B. Since this makes it possible to ensure sufficient set-up and hold times for holding data in the later-stage circuit (the elasticity buffer 12), it is possible to greatly increase the reliability of data reception.

In addition, this embodiment efficiently utilizes the outputs of the differential output comparators (inversion circuits) within the VCO of the HSPLL 22 as the five-phase (multi-phase) clocks CLK0 to CLK4 used for detecting DIN edges and generating SCLK. It is therefore unnecessary to provide separate new circuitry for generating CLK0 to CLK4, making it possible to reduce the size of the circuitry.

2.3 Detailed Example of HSPLL

Figure 14:
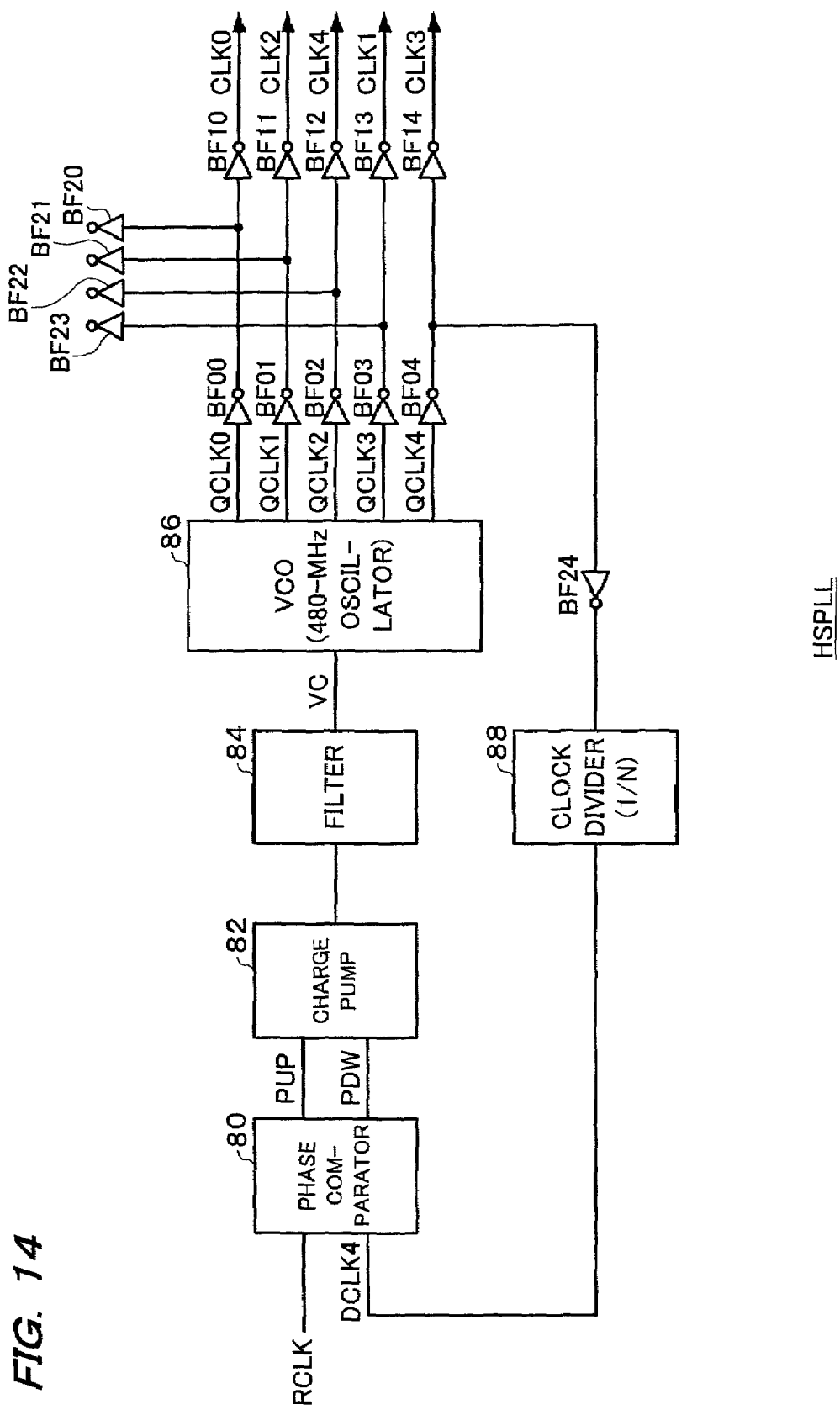
FIG. 14 shows an example of the configuration of the high-speed phase-locked loop (HSPLL)

A detailed example of the configuration of the HSPLL 22 is shown in FIG. 14.

This HSPLL 22 comprises a phase comparator 80, a charge pump circuit 82, a filter circuit 84, a voltage-controlled oscillator (VCO) 86, and a clock divider 88.

The phase comparator 80 compares the phases of a base clock RCLK (of, for example, 12 to 24 MHz) and a clock DCLK4 from the clock divider 88, then outputs a phase error signal PUP or PDW (where PUP is a phase-advanced signal and PDW is a phase-retarded signal).

The charge pump circuit 82 operates as a charge pump on the basis of the PUP or PDW signal from the phase comparator 80. More specifically, if PUP is active the charge pump circuit 82 charges a capacitor within the filter circuit 84; if PDW is active, it discharges the capacitor. A control voltage VC that has been smoothed by the filter circuit 84 is given to the VCO 86.

The VCO 86 performs an oscillation operation wherein the oscillation frequency is controlled in a variable manner in accordance with the control voltage VC, to generate 480-MHz clocks QCLK0 to QCLK4. If the control voltage VC is high, by way of example, the oscillation frequency also increases; if the control voltage VC is low, the oscillation frequency also decreases.

The clocks QCLK0, QCLK1, QCLK2, QCLK3, and QCLK4 generated by the VCO 86 are output to the exterior as CLK0, CLK2, CLK4, CLK1, and CLK3 through buffer circuits BF00 to BF04 and BF10 to BF14. Note that BF20 to BF23 denote dummy buffer circuits for load-compensation with another buffer circuit BF24.

The clock divider 88 takes the clock QCLK4 that is input from the VCO 86 through the buffer circuits BF04 and BF24, divides it (1/N), and outputs the result of the division as the clock DCLK4 to the phase comparator 80.

Use of the HSPLL 22 configured as shown in FIG. 14 makes it possible to generate a high-frequency 480-MHz clock CLK4 (as well as CLK0 to CLK3) that is phase-synchronized with the base clock RCLK.

Note that the HSPLL 22 of FIG. 14 could also have a configuration such that the charge pump circuit 82 is not provided. Similarly, a current-control oscillation circuit could be provided instead of the VCO 86.

Figure 15:
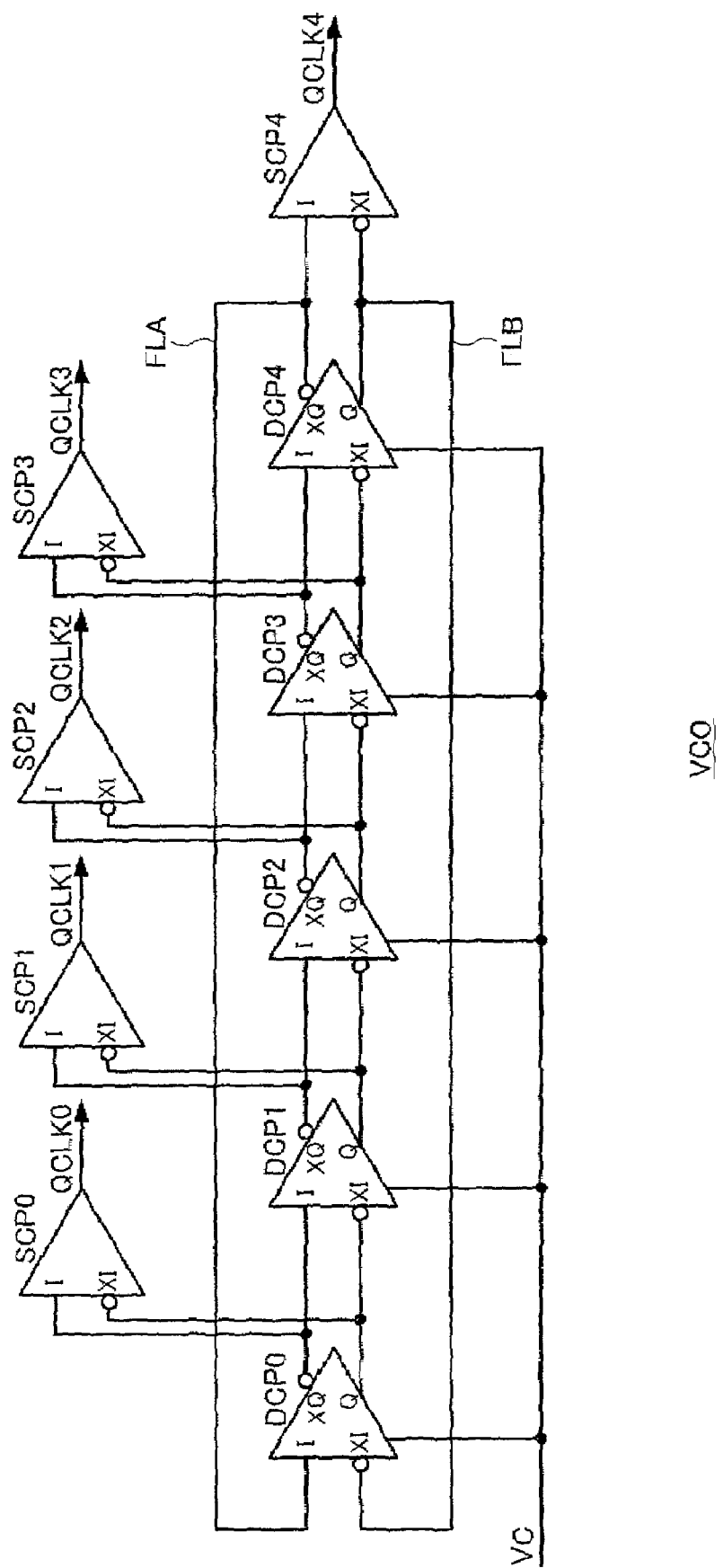
FIG. 15 shows an example of the configuration of the voltage-controlled oscillator (VCO)

An example of the configuration of the VCO 86 is shown in FIG. 15.

This VCO 86 comprises five stages (generally speaking: an odd number of stages) of serially-connected differential output comparators DCP0 to DCP4 (generally speaking: inversion circuits), such that differential outputs XQ and Q of each of DCP0 to DCP4 are input to differential inputs I and XI of corresponding single-end output comparators SCP0 to SCP4 (generally speaking: buffer circuits). Outputs of SCP0 to SCP4 become the output clocks QCLK0 to QCLK4 of the VCO 86. In addition, the output of the final-stage differential output comparator DCP4 is connected to the input of the initial-stage differential output comparator DCP0 by feedback lines FLA and FLB (feedback line pair). If the control voltage VC changes, the current flowing through the current source in the differential output comparators DCP0 to DCP4 also changes, so the oscillation frequency changes.

Figure 16A:
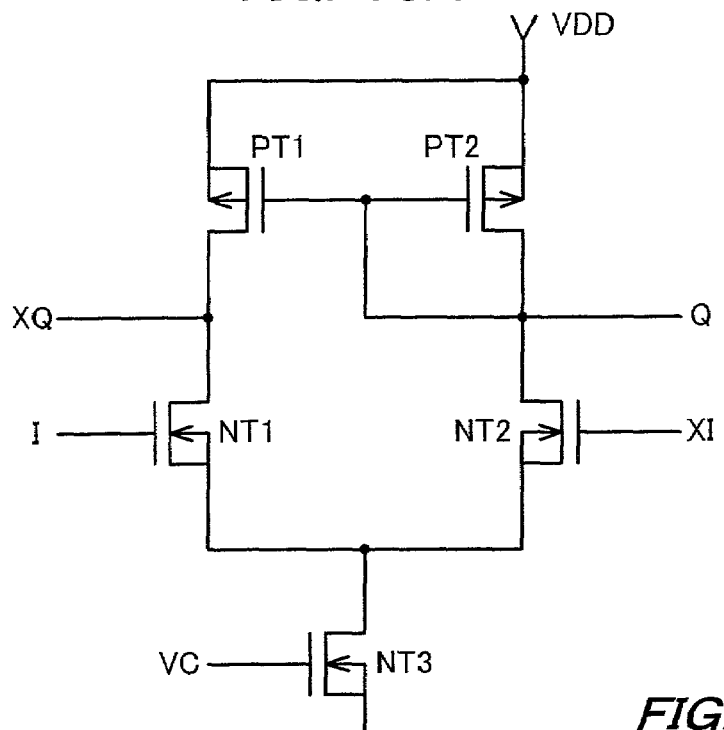
FIGS. 16A and 16B show examples of the configuration of the differential type output comparators (inversion circuits)

An example of the configuration of the differential output comparators (differential amplifiers) DCP0 to DCP4 is shown in FIG. 16A. Each of these differential output comparators comprises transistors NT1 and NT2, where the differential inputs I and XI are connected to the gate electrodes thereof and the differential outputs XQ and Q are connected to the drain electrodes thereof, and an n-type transistor NT3 (current source), where the control voltage VC is connected to the gate electrode thereof. The differential output comparator also comprises p-type transistors PT1 and PT2, where the differential output Q is connected to both gate electrodes thereof and the differential outputs XQ and Q are connected to the drain electrodes thereof.

Figure 16B:
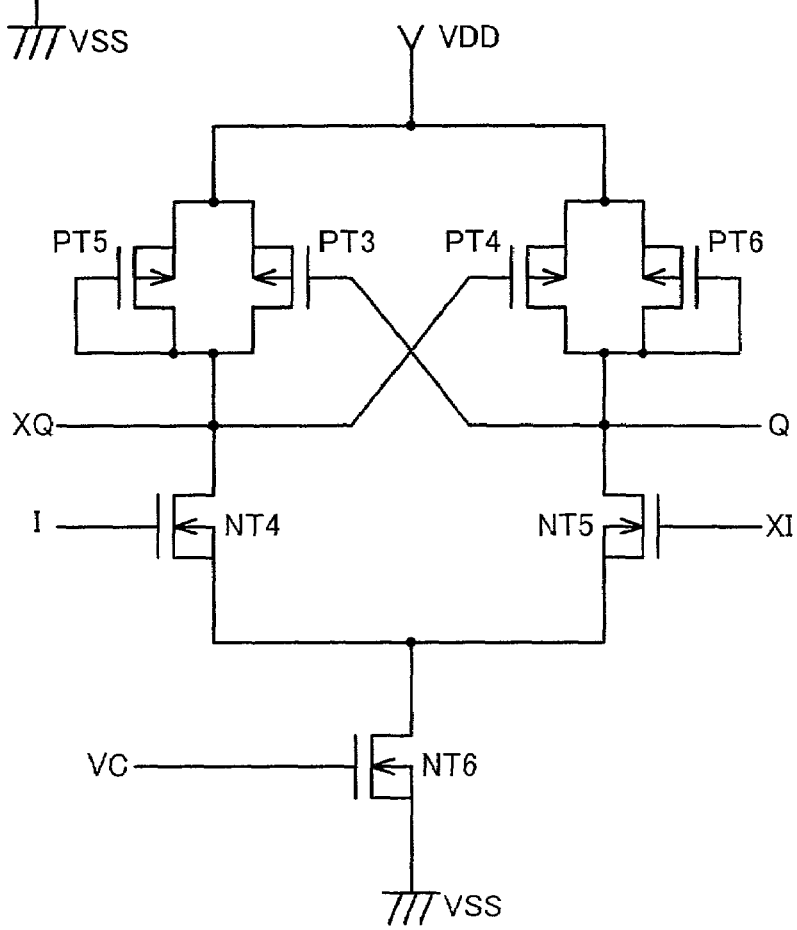

Another example of the configuration of the differential output comparators DCP0 to DCP4 is shown in FIG. 16B. Each of these differential output comparators comprises n-type transistors NT4 and NT5, where the differential inputs I and XI are connected to the gate electrodes thereof and the differential outputs XQ and Q are connected to the drain electrodes thereof, and an n-type transistor NT6 (current source), where the control voltage VC is connected to the gate electrode thereof. The differential output comparator also comprises p-type transistors PT3 and PT4, where the differential outputs Q and XQ are connected to the gate electrodes thereof and the differential outputs XQ and Q are connected to the drain electrodes thereof, and p-type transistors PT5 and PT6, where the differential outputs XQ and Q are connected to the gate and the drain electrodes thereof.

The circuit of FIG. 16B forms a multi-vibrator type of comparator with a configuration such that the components on the XQ side (PT3, PT5, and NT4) are line-symmetrical with the components on the Q side (PT4, PT6, and NT5). In other words, if the potential of Q falls, PT3 turns on and the potential of XQ rises, whereas if the potential of XQ falls, PT4 turns on and the potential of Q rises. It is therefore possible to increase the amplitude of the differential outputs Q and XQ more than in the configuration of FIG. 16A (for example, to 1.4 V to 3.2 V).

Note that the inversion circuits comprised within the VCO 86 are not limited to the differential output comparators shown in FIGS. 16A and 16B, and thus various other modifications are possible.

Figure 17:
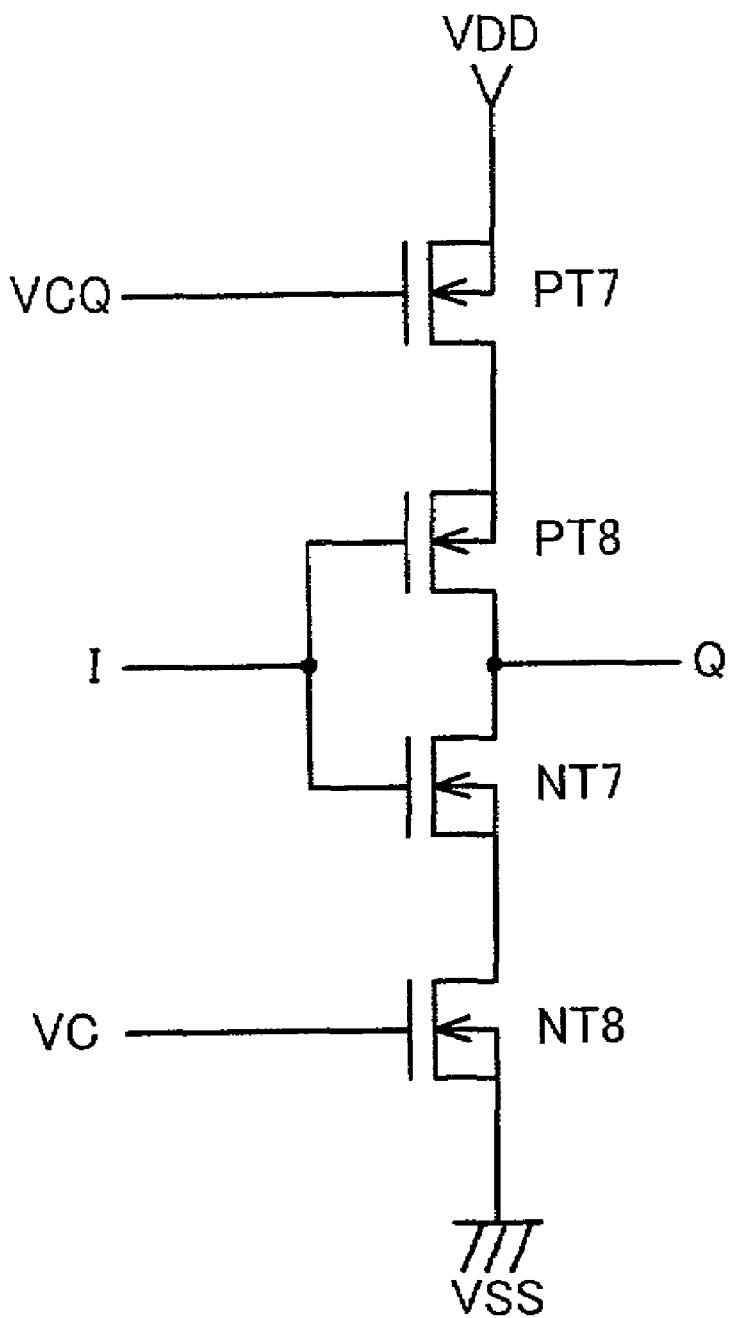
FIG. 17 shows another example of the configuration of an inversion circuit.

An inversion circuit shown by way of example in FIG. 17 has p-type transistors PT7 and PT8 and n-type transistors NT7 and NT8 connected in series. The current flowing through these transistors is controlled by control voltages VCQ and VC connected to the gate electrodes of PT7 and NT8, so that the oscillation frequency can be controlled in a variable manner.

Figure 18:
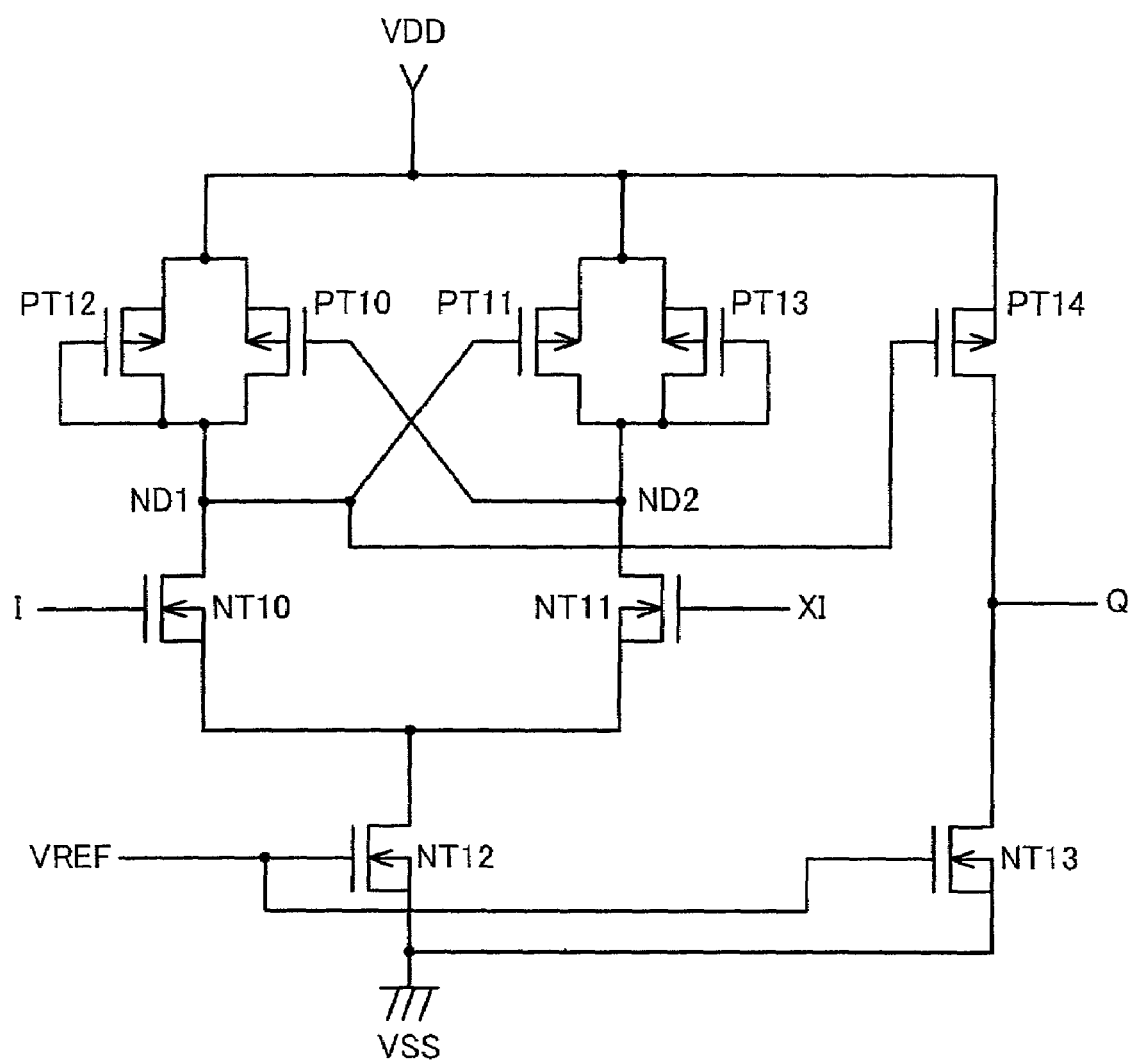
FIG. 18 shows an example of the configuration of the single-end type output comparators (buffer circuits)

An example of the configuration of the single-end output comparators SCP0 to SCP4 is shown in FIG. 18.

The differential portion of the single-end output comparator shown in FIG. 18 comprises n-type transistors NT10 and NT11, where the differential inputs I and XI are connected to the gate electrodes thereof and nodes ND1 and ND2 are connected to the drain electrodes thereof, and an n-type transistor NT12 (current source), where a reference voltage VREF is connected to the gate electrode thereof. This differential portion also comprises p-type transistors PT10 and PT11, where the nodes ND2 and ND1 are connected to the gate electrodes thereof and the nodes ND1 and ND2 are connected to the drain electrodes thereof, and p-type transistors PT12 and PT13, where the nodes ND1 and ND2 are connected to the gate electrodes and the drain electrodes thereof.

The output portion of the single-end output comparator of FIG. 18 comprises a p-type transistor PT14, where the node ND1 is connected to the gate electrode thereof and the drain electrode is connected to the single-end output Q, and an n-type transistor NT13 (current source), where the reference voltage VREF is connected to the gate electrode thereof and the drain electrode is connected to the single-end output Q.

In the above described embodiment, the outputs of the five-stage differential output comparators DCP0 to DCP4 (inversion circuits) of FIG. 15 are used to obtain the five-phase clocks CLK0 to CLK4 described with reference to FIGS. 12, 13A, and 13B. These differential output comparators DCP0 to DCP4 are essential for the oscillation of the VCO 86, from the start. Therefore, use of the outputs of those differential output comparators DCP0 to DCP4 in the generation of the five-phase clock CLK0 to CLK4 make it unnecessary to provide separate new circuits for generating CLK0 to CLK4, thus making the circuitry more compact.

2.4 Detailed Example of Edge Detection Circuit and Clock Selection Circuit

Figure 19:
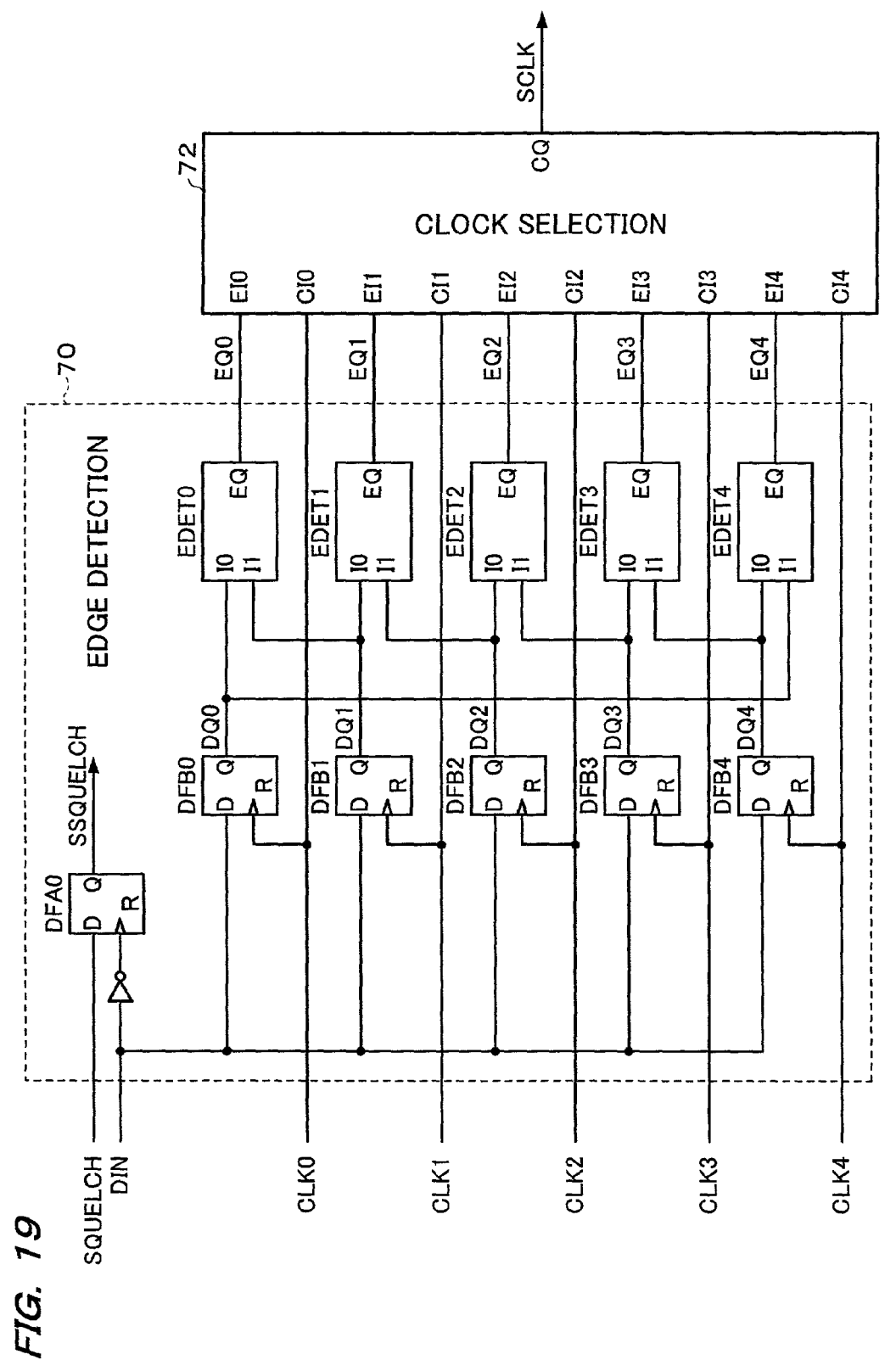

An example of the configuration of the edge detection circuit 70 and the clock selection circuit 72 is shown in FIG. 19.

The edge detection circuit 70 comprises a D flip-flop DFA0, D flip-flops DFB0 to DFB4 (first to Nth holding circuits), and detection circuits EDET0 to EDET4 (first to Nth detection circuits).

In this example, the D flip-flop DFA0 samples and holds a signal SQUELCH based on edges of the data DIN, and outputs a signal SSQUELCH.

The D flip-flop DFB0 (the first holding circuit) samples and holds the data DIN by using the edge of the clock CLK0. Similarly, DFB1 (the second holding circuit) holds DIN by using CLK1, DFB2 (the third holding circuit) holds DIN by using CLK2, DFB3 (the fourth holding circuit) holds DIN by using CLK3, and DFB4 (the fifth holding circuit) holds DIN by using CLK4.

The detection circuits EDET0 to EDET4 perform exclusive-OR operations based on outputs DQ0 to DQ4 (held data) of the D flip-flops DFB0 to DFB4, to detect whether there is an edge of the data DIN between any of the edges of the clocks CLK0 to CLK4.

More specifically, the detection circuit EDET0 (the first detection circuit) detects whether or not there is an edge of the data DIN between edges of the clocks CLK0 and CLK1, based on the outputs DQ0 and DQ1 of the D flip-flops DFB0 and DFB1. Similarly, EDET1 (the second detection circuit) detects whether or not there is an edge of DIN between edges of CLK1 and CLK2, based on the outputs DQ0 and DQ2 of DFB0 and DFB2. Furthermore, EDET2 (the third detection circuit) detects whether or not there is an edge of DIN between edges of CLK2 and CLK3, based on the outputs DQ2 and DQ3 of DFB2 and DFB3, EDET3 (the fourth detection circuit) detects whether or not there is an edge of DIN between edges of CLK3 and CLK4, based on the outputs DQ3 and DQ4 of DFB3 and DFB4, and EDET4 (the fifth detection circuit) detects whether or not there is an edge of DIN between edges of CLK4 and CLK0, based on the outputs DQ4 and DQ0 of DFB4 and DFB0.

The clock selection circuit 72 (clock selection circuit) selects one of the clocks CLK0 to CLK4 on the basis of the outputs EQ0 to EQ4 (edge detection information) of the detection circuits EDET0 to EDET4, and outputs the selected clock as the sampling clock SCLK.

Figure 20:
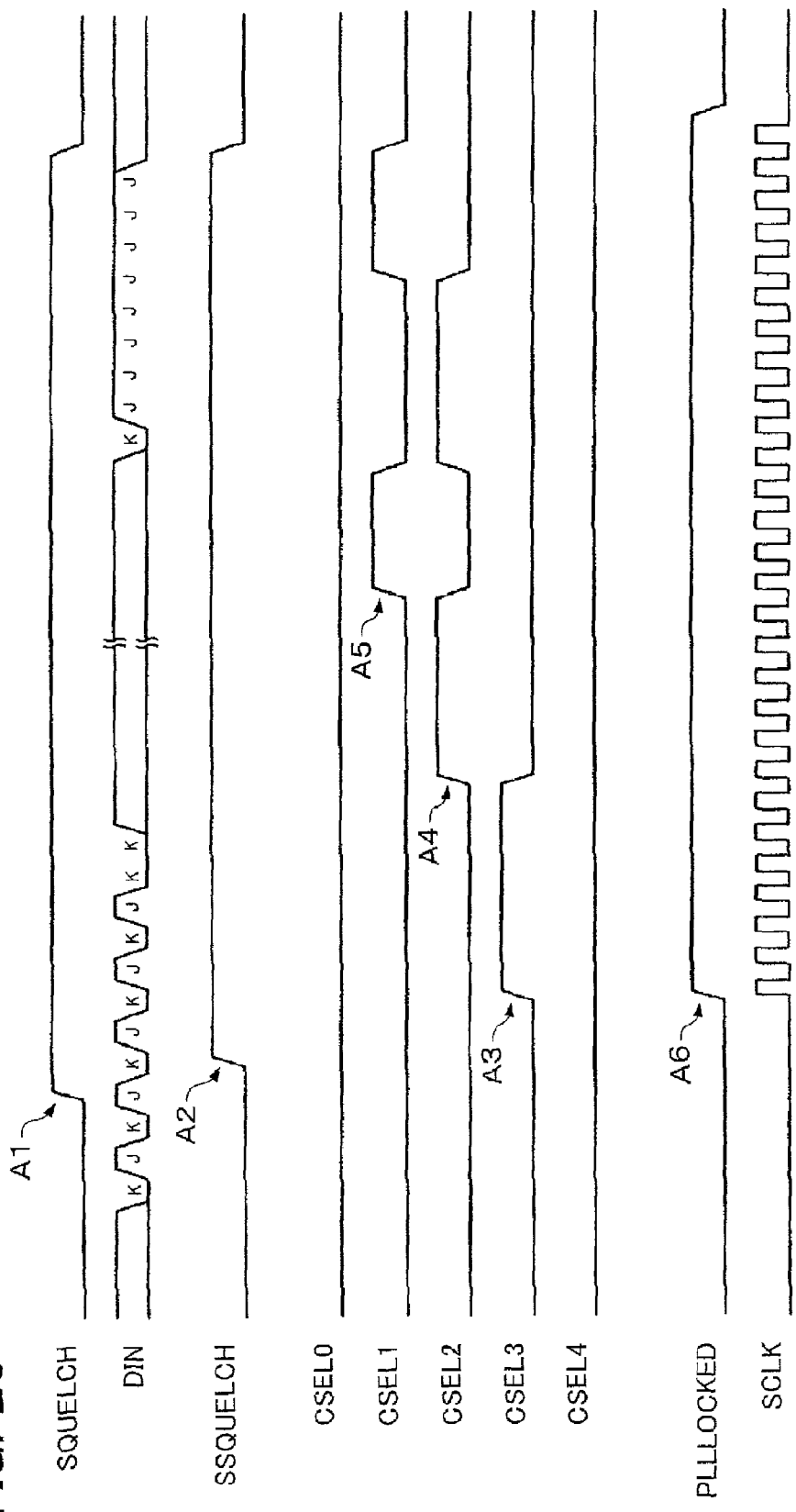
FIG. 20 is a timing waveform chart illustrating the operation of this embodiment.
Figure 21:
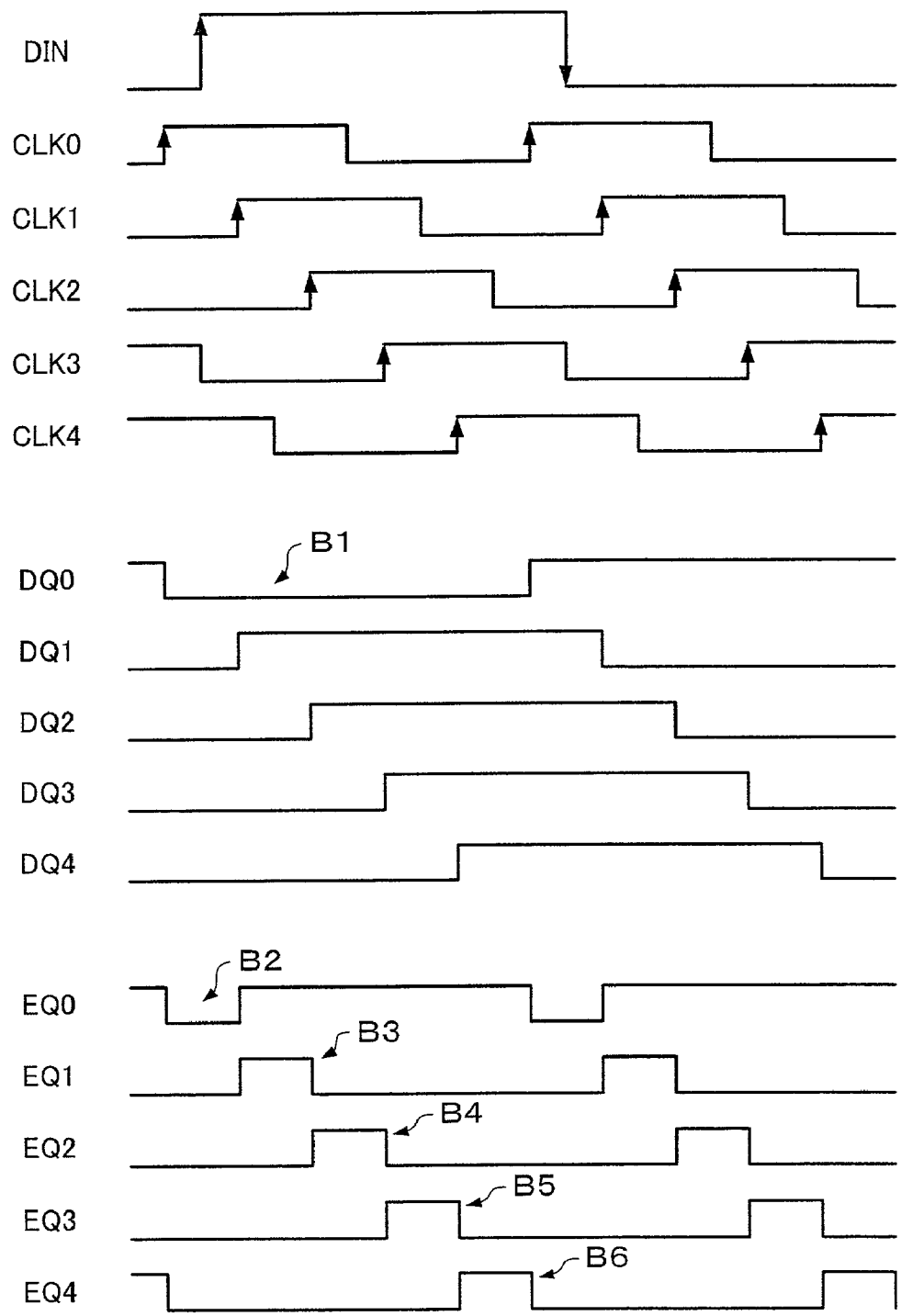
FIG. 21 is a timing waveform chart further illustrating the operation of this embodiment.

Timing waveform charts shown in FIGS. 20 and 21 illustrate the operation of this embodiment.

If the signal SQUELCH, which is used for determining whether or not there is noise in the data DIN, goes to 1 (logic level, hereinafter the same), as shown at A1 in FIG. 20, that is held in the D flip-flop DFA0 of FIG. 19 at the falling edge of DIN and SSQUELCH also goes to 1, as shown at A2. When SSQUELCH goes to 1, the edge detection operation of the edge detection circuit 70 is enabled.

When that happens, the D flip-flops DFB0 to DFB4 hold the data DIN at the rising edges of CLK0 to CLK4 and output DQ0 to DQ4, as shown at B1 in FIG. 21. The detection circuit EDET0 performs an exclusive-OR operation on DQ0 and DQ1, by way of example, and outputs EQ0, as shown at B2. Similarly, the detection circuits EDET1, EDET2, EDET3, and EDET4 perform exclusive-OR operations on DQ1 and DQ2, DQ2 and DQ3, DQ3 and DQ4, and DQ4 and DQ0, to output EQ1 to EQ4.

The clock selection circuit 72 determines which of the clocks CLK0 to CLK4 is to be selected, based on these outputs EQ0 to EQ4. Since an edge of the data is detected between the edges of the clocks CLK0 and CLK1 in the example shown at B2 in FIG. 21, the clock CLK4 that has an edge that is shifted by three edges (or a given set number M of edges) from the edge of DIN is selected (see FIG. 13A) and output as the sampling clock SCLK.

This clock selection can be implemented by a combinational circuit (not shown in the figure) within clock selection circuit 72 that generates clock selection signals CSEL0 to CSEL4 shown in FIG. 20, then performs logical operations on these CSEL0 to CSEL4 signals and CLK0 to CLK4.

Since the clock selection signal CSEL3 goes active (to 1) at A3 in FIG. 20 in this example, the clock CLK3 is selected and output as the sampling clock SCLK. Similarly, since CSEL2 and CSEL1 go active at A4 and A5, CLK2 and CLK1 are selected in each of those cases, for output as SCLK.

Note that the selection of the clock by the clock selection circuit 72 is enabled on condition that a signal PLLLOCKED, which indicates that the phase synchronization of the HSPLL 22 has been locked, has gone active as shown at A6 in FIG. 20.

2.5 Ensuring of Set-up and Hold Times

Figure 22:
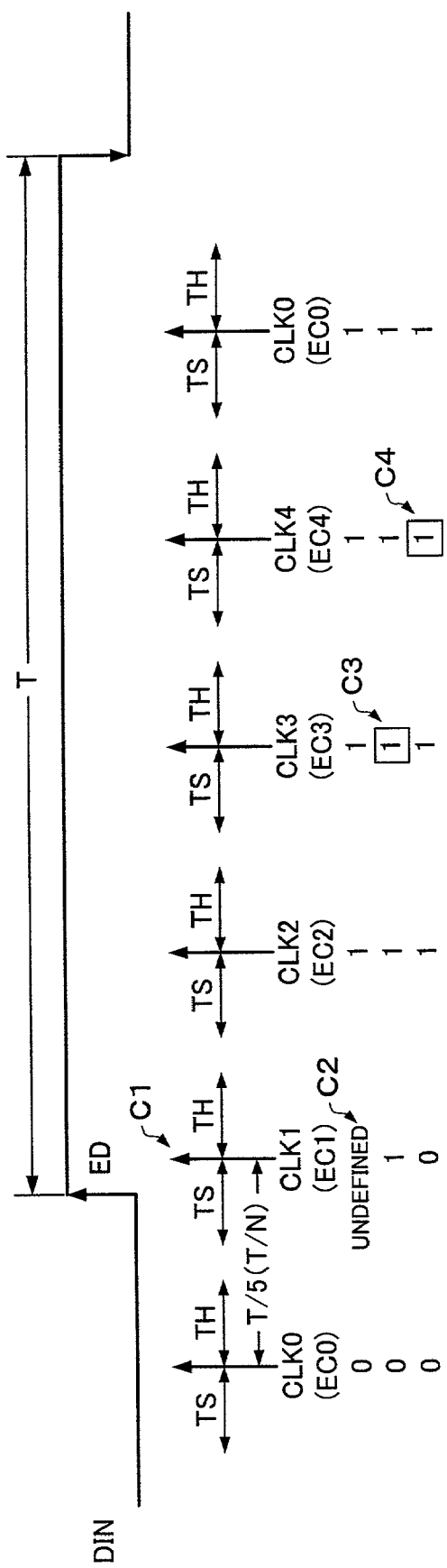
FIG. 22 is illustrative of the method of setting the number of clocks N.

The discussion now considers a case in which the D flip-flops (holding circuits) DFB0 to DFB4 of FIG. 19 hold the data DIN by using CLK0 to CLK4 at the timing shown in FIG. 22.

In this case, the edge ED of the data DIN and an edge EC1 of CLK1 come close at C1 in FIG. 22, so the set-up time TS for the D flip-flop DFB1 (see FIG. 19) which holds DIN at CLK1 is insufficient. Thus the held data becomes "undefined" at C2 in FIG. 22, so it is not possible to determine whether it is 0 or 1.

In such a case, however, this embodiment ensures that the clock that has an edge that is shifted by just three (M) edges from the edge ED of DIN (the position at which ED is assumed to be detected) is selected as the sampling clock SCLK, as shown at C3 and C4 in FIG. 22, ensuring that a suitable SCLK can be generated. In other words, the fetched edge of SCLK can be positioned close to the center between edges of DIN, as shown at C4 in FIG. 22, even if CLK3 is selected as SCLK as shown at C3 or if CLK4 is selected as SCLK as shown at C4. It is therefore possible for the later-stage circuit (elasticity buffer) to use the thus-generated SCLK to sample and hold DIN.

It should be noted that if the period of the multi-phase clocks CLK0 to CLKN (CLK0 to CLK4) is T, the number of clocks is N (=5), the set-up time of each D flip-flop (holding circuit) is TS, and the hold time thereof is TH, the following equation holds:

$$T/N > TS + TH \quad (1)$$

Rearranging Equation (1) gives:

$$N < T/(TS + TH) \quad (2)$$

or:

$$N \leq [T/(TS + TH)] \quad (3)$$

where [X] in Equation (3) is the maximum integer that does not exceed X.

If it is assumed by way of example that T=2.08 nanoseconds (ns) and TS=TP=0.4 ns, N≤5. In other words, if the number of multi-phase clocks is set to satisfy N≤5 in this case, the set-up and hold times between the multi-phase clocks will not overlap.

An example in which the number of multi-phase clocks is increased to seven clocks CLK0 to CLK6 is shown in FIG. 23A. In other words, if the outputs of the inversion circuits (differential output comparators) within the HSPLL 22 (see FIG. 12) are used as multi-phase clocks, the number of inversion circuit stages is made to be an odd number, to ensure that the VCO oscillates by negative feedback (ring oscillator), and the number of multi-phase clocks is also made odd. Therefore, the next largest number of multi-phase clocks after five is this value of seven.

If seven multi-phase clocks CLK0 to CLK6 are used, as shown in FIG. 23A, it is possible that the relationship expressed by Equations (1), (2), and (3) can no longer be satisfied.

Since the edge ED of DIN and the edge EC0 of CLK0 are close at D1 in FIG. 23A, by way of example, the hold time TH for the D flip-flop DFB0 (see FIG. 19) that holds DIN at CLK0 is not sufficient. The held data therefore becomes undefined, as shown at D2, so that it is no longer possible to verify whether it is 0 or 1.

Similarly, the edge ED of DIN and the edge EC1 of CLK1 are close at D3 in FIG. 23A, so the set-up time TS for the D flip-flop DFB1 that holds DIN at CLK1 is not sufficient. This means that the held data becomes undefined, as shown at D4, so that it is no longer possible to verify whether it is 0 or 1.

If there are two points at which this "undefined" occurs, it is not possible to select a suitable clock as the sampling clock SCLK. In other words, although a clock that has an edge which is shifted by just three edges away from the edge ED of DIN is selected as SCLK in the example shown in FIG. 22, it is not possible to obtain a suitable SCLK by this selection method in the example shown in FIG. 23A.

In order to prevent such a state, therefore, the number N of multi-phase clocks is preferably set in such a manner as to satisfy the relationship N≤[T/(TS+TH)].

An example in which the number of multi-phase clocks is set to three (the next odd number below five) instead of five is shown in FIG. 23B.

If a clock that has an edge which is shifted by just two edges from the edge ED of DIN is selected as SCLK, by way of example, CLK2 is selected at E1 in FIG. 23B and CLK0 is selected at E2.

However, only a clock having an edge that is shifted by just two edges can be selected in the example shown in FIG. 23B, it is not possible to select a clock that has an edge shifted by three or four edges from the edge ED of DIN. This method therefore has the disadvantage of a narrow selection tree for selectable clocks.

In contrast thereto, the configuration shown in FIG. 22 has the advantage of making it possible to select a clock having an edge that is shifted between two and four edges from the edge ED of DIN, thus broadening the range for selecting a clock.

Therefor, in order to broader the range of the clock selection, the number N of multi-phase clocks is preferably made to be the largest possible number while maintaining the relationship: N≤[T/(TS+TH)] (where [X] is the maximum integer that does not exceed X). In other words, it is desirable that N=[T/(TS+TH)].

Note that if the number of stages of inversion circuits (differential output comparators) within the HSPLL 22 of FIG. 12 is increased, a problem arises in that it is not possible to ensure a high oscillation frequency. If the outputs of the inversions circuits of the HSPLL 22 are used as the multi-phase clocks CLK0 to CLKN, therefore, it is desirable to make the number of number of clocks N larger within the range that can ensure a high oscillation frequency.

More specifically, if N=5, it becomes possible to select a clock having an edge that is shifted by 2 to 4 edges from the edge of the data and a sufficient selection range can be ensured.

If N=5, on the other hand, the number of inversion circuit stages of the HSPLL 22 can be set to five and high-frequency oscillation of the VCO (oscillation circuit) of the HSPLL 22 can be ensured. As a result, it is possible to obtain a high-frequency sampling clock.

2.6 Clock Selection

When the sampling clock SCLK generated by the sampling clock generation circuit of this embodiment is used directly in the sampling of the data DIN, it is preferable that a clock that is positioned close to the direct center between rising and falling edges of DIN is used as SCLK, as shown in FIG. 24A.

If a five-phase clock CLK0 to CLK4 is used, as shown by way of example in FIG. 24A, the clock CLK3 that has an edge that is shifted by just three edges (or the set number M of edges) from the edge ED of the data DIN is selected as the sampling clock SCLK.

This makes it possible to ensure sufficient set-up and hold times when the later-stage circuitry uses the sampling clock SCLK to hold the data DIN.

However, it can happen that the later-stage circuitry does not use the sampling clock SCLK from the sampling clock generation circuit directly but instead uses a clock SCLK' which is obtained by applying a logical operation to SCLK.

In such a case, it is possible that the element delay caused by the logical operation applied to SCLK will shift the position of an edge ES' of SCLK' will be delayed beyond the edge ED of SCLK, as shown in FIG. 24B.

From consideration of signal delays, therefore, the clock CLK2 having an edge that is shifted by just two edges from the edge ED of the data DIN is selected as SCLK, as shown by way of example in FIG. 24B. The later-stage circuit uses SCLK', which is a clock obtained by subjecting this SCLK to a logical operation or the like, for holding the data DIN. This makes it possible to ensure sufficient set-up and hold times when the later-stage circuit holds DIN.

The number M of the shift from the edge ED of DIN is preferably set to be variable to accord with the configuration of the later-stage circuit.

Note that DIN could also be delayed by a delay element before output to the later-stage circuit, to ensure that the data DIN can be sampled in a suitable manner by SCLK'.

Figure 25:
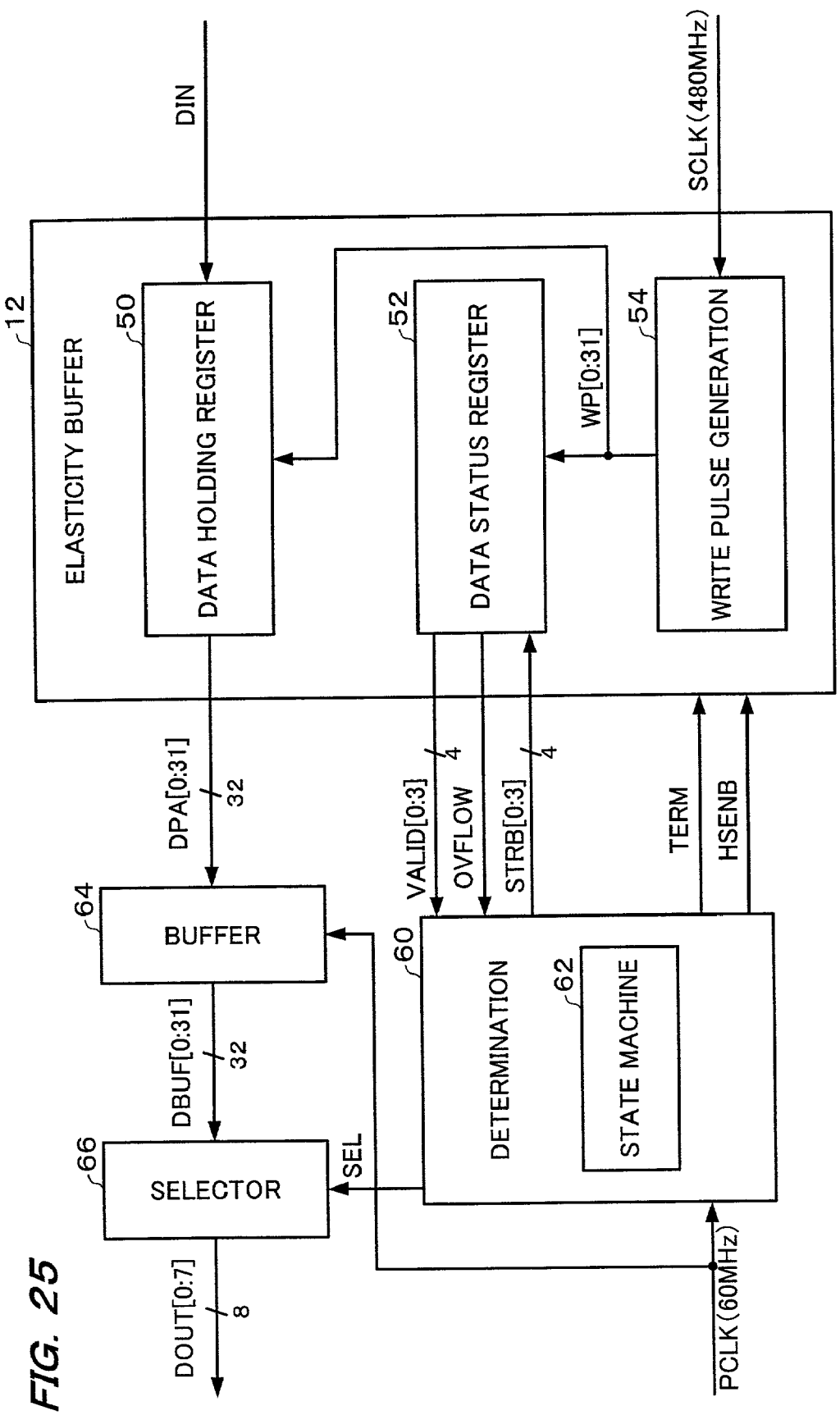
FIG. 25 shows an example of the configuration of the elasticity buffer.

An example of the configuration of the elasticity buffer 12 that is a later-stage circuit is shown in FIG. 25. Note that the elasticity buffer 12 is a circuit comprised within the HS circuit 410, and a determination circuit 60, a buffer 64, and a selector 66 are comprised within another component such as the data handler circuit 400 of FIG. 1, by way of example.

The elasticity buffer 12 comprises a data holding register 50 (data holding circuit), a data status register 52 (data status holding circuit), and a write pulse generation circuit 54 (write pulse generation circuit).

In this case, the data holding register 50 is a 32-bit wide register that receives the serial data DIN and holds it.

The data status register 52 is a 32-bit wide register that holds the status of each bit of data in the data holding register 50.

The write pulse generation circuit 54 generates a 32-bit wide write pulse signal WP[0:31] and outputs it to the data holding register 50 and the data status register 52.

In this case, the write pulse signal WP[0:31] is a signal in which each pulse goes active periodically every 32 clock cycles of the sampling clock SCLK (generally speaking: every Kth clock cycle) and the periods at which each pulse goes active are each shifted by one clock cycle. The data holding register 50 holds each bit of data, based on this write pulse signal WP[0:31]. Similarly, the data status register 52 holds each bit of the status, based on this write pulse signal WP[0:31].

The determination circuit 60 determines whether or not data that is held in the data holding register 50 is valid, in data cell units configured of a plurality of bits (such as 8 bits), and which operates in accordance with an internal state machine 62.

More specifically, the determination circuit 60 receives from the data status register 52 a 4-bit wide signal VALID[0:3] that indicates whether or not each data cell of the data holding register 50 is valid and a signal OVFLOW that becomes active when the data holding register 50 overflows.

It also determines whether or not each data cell is valid and outputs to the selector 66 a signal SEL for selecting valid data cells. In addition, it outputs to the data status register 52 a signal STRB[0:3] for clearing the data statuses held in the data status register 52, in data cell units, and it outputs to the elasticity buffer 12 a signal TERM that goes active at the completion of packet reception in HS mode and a signal HSENB that enables reception in HS mode.

The buffer 64 receives 32-bit wide parallel data DPA[0:31] from the data holding register 50 and outputs data DBUF[0:31], which has been buffered in synchronization with a 60-MHz clock PCLK, to the selector 66.

The selector 66 (output circuit) selects data in valid data cells from the data DBUF[0:31] from the buffer 64, based on the signal SEL from the determination circuit 60, and outputs it as 8-bit wide data DOUT[0:7].

The elasticity buffer 12 of FIG. 25 uses the write pulse signal WP[0:31] from the write pulse generation circuit 54 for the holding of data by the data holding register 50, not SCLK from the sampling clock generation circuit. In other words, the data is held by using WP[0:31], which is generated by subjecting SCLK to a logical operation or the like. It is therefore desirable when selecting the clock to determine the set number M from consideration of element delay due to the write pulse generation circuit 54, as described with reference to FIGS. 24A and 24B.

2.7 Circuit Layout

Figure 26:
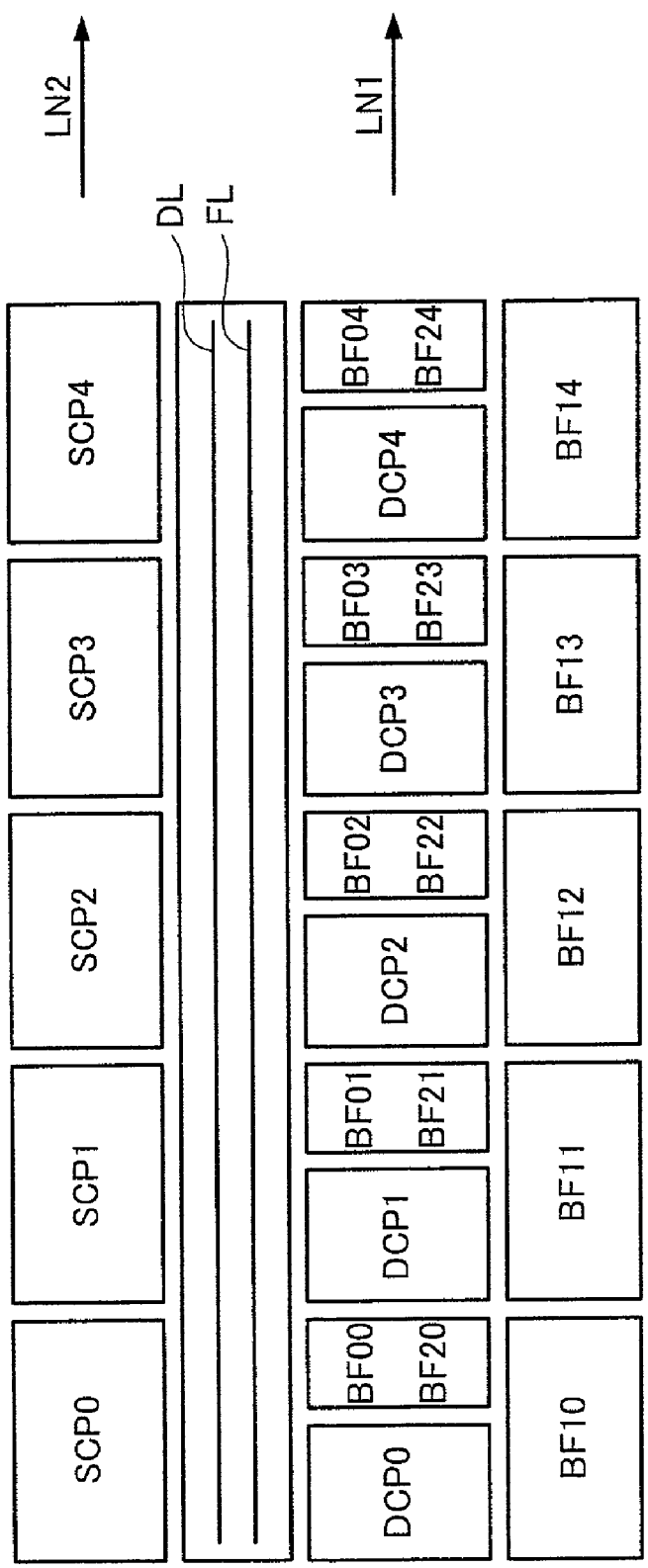
FIG. 26 is illustrative of the method of arranging the inversion circuits DCP0 to DCP4 and the buffer circuits SCP0 to SCP4.

An example of the layout of the inversion circuits DCP0 to DCP4 (differential output comparators) and buffer circuits SCP0 to SCP4 (single-end output comparators) of FIG. 15 and the buffer circuits BF00 to BF04, BF20 to BF24, and BF10 to BF14 of FIG. 14 is shown in FIG. 26.

Note that the locations at which the buffer circuits SCP0 to SCP3 (equivalent to BF0 to BF4), BF00 to BF04, BF20 to BF24, and BF10 to BF14 are disposed, using the method described with reference to FIG. 5, can be exchanged.

In FIG. 26, the inversion circuits DCP0 to DCP4 are disposed along a line LN1 (first line) that is parallel to a feedback line FL (the feedback line pair FLA and FLB of FIG. 15), in a similar manner to the disposition method of the inversion circuits DCP0 to DCP4 described with reference to FIGS. 1 to 10, whereas the buffer circuits SCP0 to SCP4 are disposed along a line LN2 (second line) that is also parallel to FL but differs from LN1. This configuration makes it possible to shorten the length of the feedback line FL and equalize the phase differences between the multi-phase clocks.

FIG. 26 also shows that the feedback line FL is disposed in a region between the inversion circuits DCP0 to DCP4 and the buffer circuits SCP0 to SCP4. This makes it possible to prevent the addition of excess parasitic capacitance to the output of the inversion circuit DCP4.

The configuration shown in FIG. 26 is also provided with a dummy line DL (DLA0 to DLA3 and DLB0 to DLB3), where the dummy line DL and the feedback line FL are disposed in the region between the inversion circuits DCP0 to DCP4 and the buffer circuits SCP0 to SCP4. This ensures that the parasitic capacitances of the outputs of the inversion circuits DCP0 to DCP4 can be made equal (equivalent), making it possible to generate multi-phase clocks which have substantially the same phase difference (signal delay difference), but which are shifted sequentially.

With this embodiment, multi-phase clocks CLK0 to CLK4 (first to Nth clocks) generated by the multi-phase clock generation circuit 22 (the circuitry disposed as shown in FIG. 26) are used to generate the sampling clock SCLK that the sampling clock generation circuit 10 uses for sampling the data DIN.

The wiring of the lines CLK0 to CLK4 in accordance with this embodiment of the present invention is done in such a manner that the parasitic capacitances of the lines of the clocks CLK0 to CLK4 (the lines connected to the outputs of the buffer circuits BF10 to BF14 of FIG. 26) are equal (including cases in which they are substantially equal).

Figure 27:
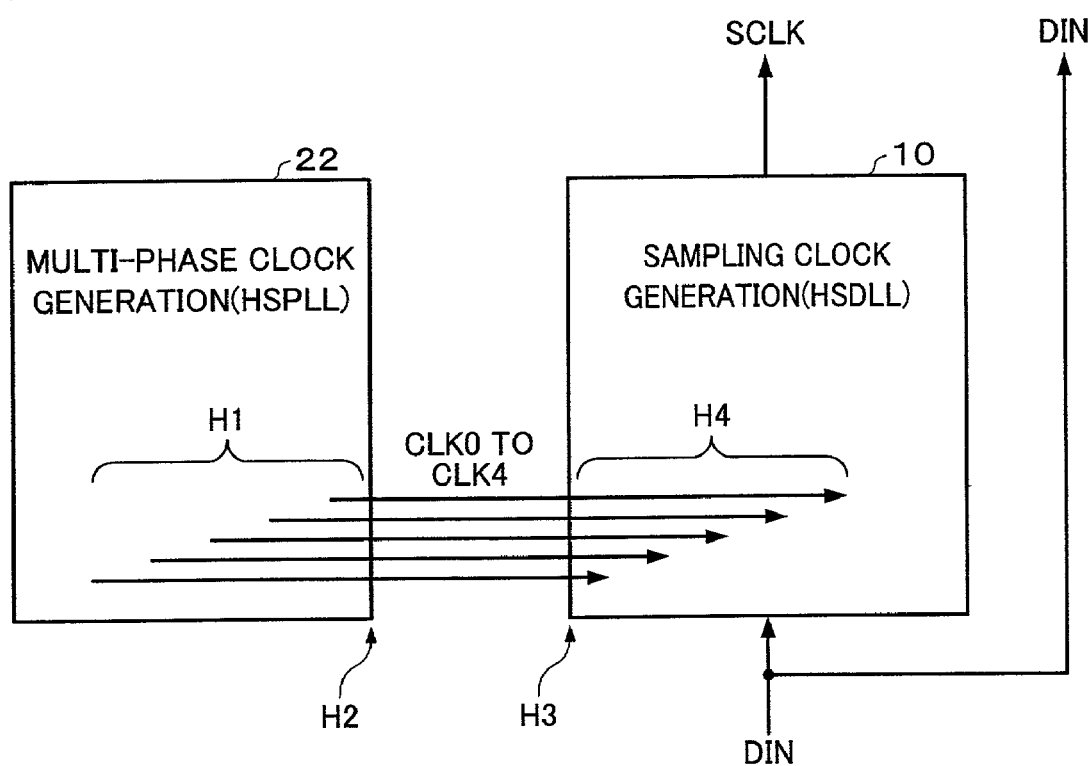
FIG. 27 is illustrative of the method of wiring clock lines.
Figure 28:
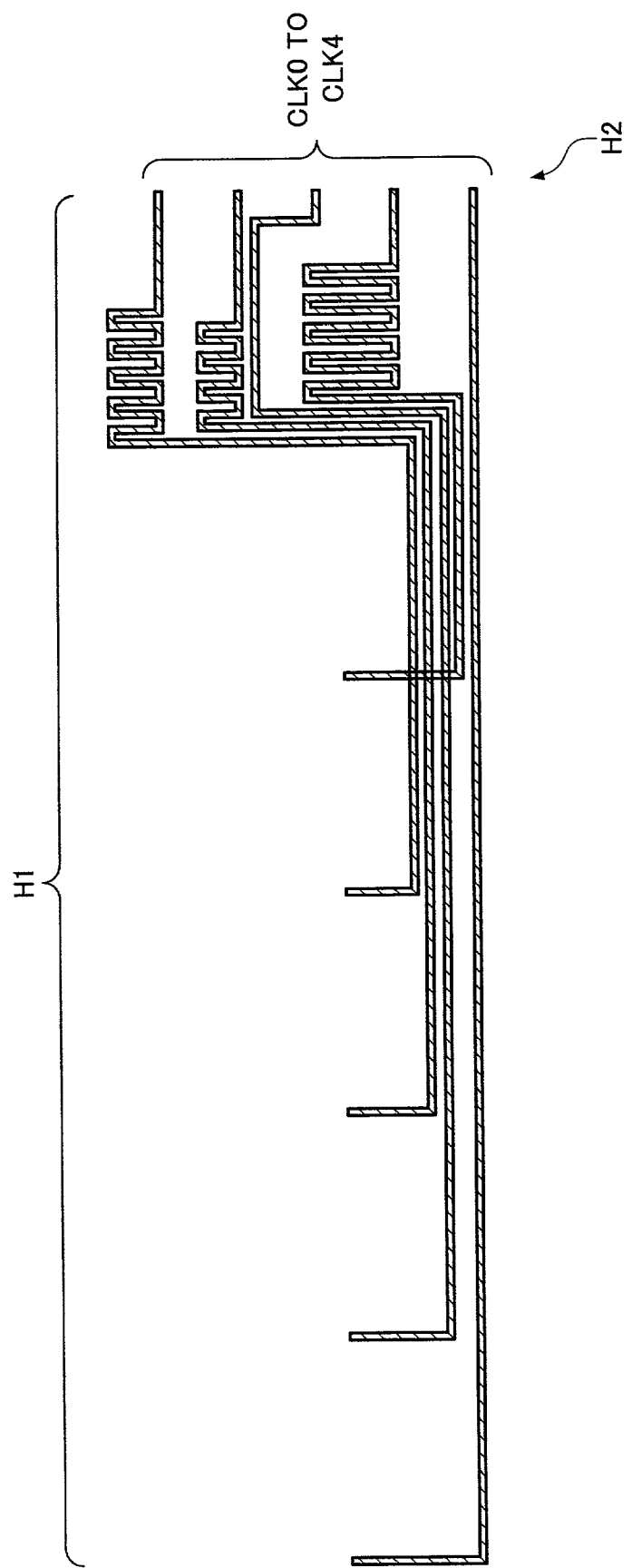
FIG. 28 is illustrative of the method of wiring clock lines on the multi-phase clock generation circuit side.

More specifically, the wiring of the lines for CLK0 to CLK4 on the multi-phase clock generation circuit 22 side of FIG. 27 (the wiring denoted by H1) could be done as shown in FIG. 28 by way of example. In other words, these lines are made to be deliberately curved, in such a manner that the lengths of the lines of the clocks CLK0 to CLK4 on the multi-phase clock generation circuit 22 side are equal (including substantially equal), as shown in FIG. 28. This configuration makes it possible to ensure that the parasitic capacitances of the lines for CLK0 to CLK4 are equal (equivalent) within the portion up to the output terminals of the multi-phase clock generation circuit 22 (denoted by H2 in FIG. 27).

With this embodiment, the wiring of CLK0 to CLK4 in the portion from the output terminals of the multi-phase clock generation circuit 22 (denoted by H2) to the input terminals of the sampling clock generation circuit 10 (denoted by H3) is done in such a manner that the parasitic capacitances of the lines for CLK0 to CLK4 are equal (equivalent). In other words, the lengths of the lines for CLK0 to CLK4 are equal in the portion between H2 and H3.

Figure 29:
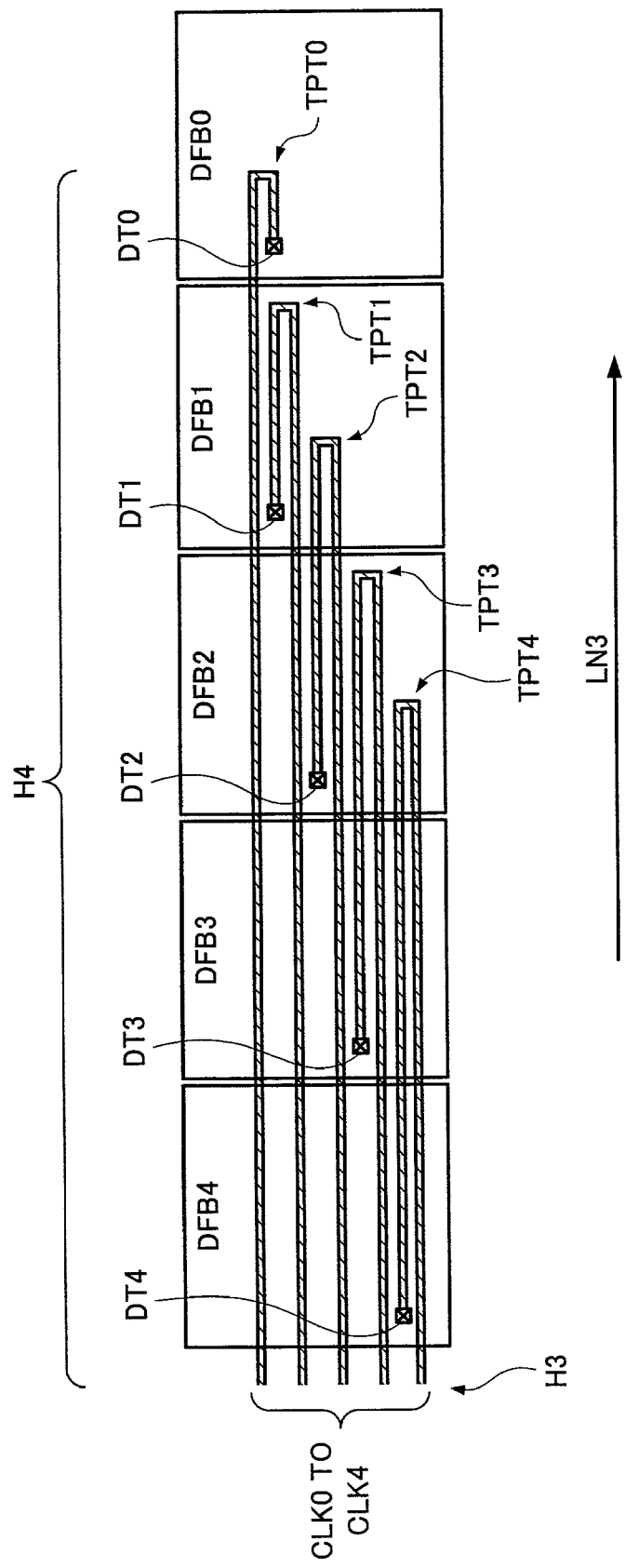
FIG. 29 is illustrative of the method of wiring clock lines on the sampling clock generation circuit side.

In addition, the wiring of this embodiment is done in such a manner that the lines for CLK0 to CLK4 (denoted by H4) on the sampling clock generation circuit 10 side of FIG. 27 are wired as shown in FIG. 29, by way of example.

In other words, FIG. 29 shows that the layout ensures that the lengths of the lines for CLK0 to CLK4 are equal from the input terminals of the sampling clock generation circuit 10 (denoted by H3) to the D terminals DT0 to DT4 of the D flip-flops DFB0 to DFB4 (see FIG. 19).

More specifically, the D flip-flops DFB0 to DFB4 (first to Nth holding circuits) that hold the data DIN by using the clocks CLK0 to CLK4 are disposed along a line LN3 that is parallel to the lines for CLK0 to CLK4, as shown in FIG. 29.

The lines for the clocks CLK0 to CLK4 are connected to the corresponding D terminals DT0 to DT4 (DFB0 to DFB4 inputs) of the D flip-flops DFB0 to DFB4, after looping back in the opposite direction at loop-back points TPT0 to TPT4 (first to Nth loop-back points). In this case, these loop-back points TPT0 to TPT4 are provided at locations where the parasitic capacitances of the lines for CLK0 to CLK4 are mutually equal.

This configuration makes it possible to ensure that the parasitic capacitances of the lines for CLK0 to CLK4 on the sampling clock generation circuit 10 side are mutually equal.

With the wiring method shown in FIG. 29 in particular, where CLK0 to CLK4 are looped back at the loop-back points TPT0 to TPT4 and are input to DFB0 to DFB4, it is possible to ensure that there are the same number of loop-backs in each of the lines for CLK0 to CLK4 (for example, number of loop-backs=1). This makes it possible to further reduce the differences in capacitances inherent to the lines CLK0 to CLK4.

3. Electronic Instrument

The description now turns to examples of electronic instrument comprising the data transfer control device of this embodiment.

Figure 30A:
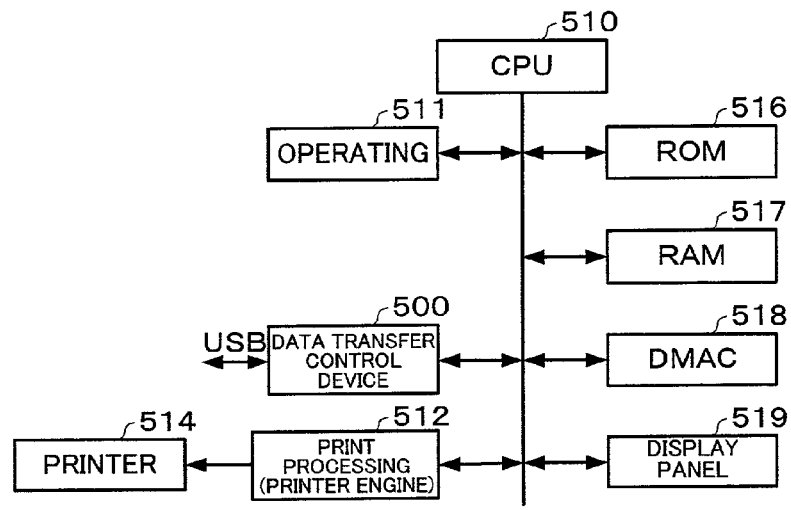
FIGS. 30A, 30B, and 30C are internal block diagrams of various electronic instruments.
Figure 31A:
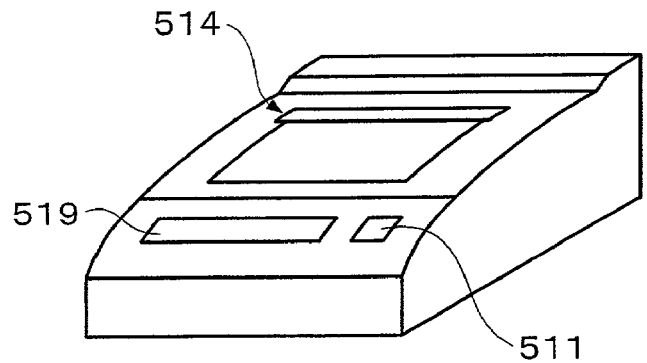
FIGS. 31A, 31B, and 31C show typical external views of various electronic instruments.

An internal block diagram of a printer that is one example of such electronic instruments is shown in FIG. 30A, with an external view thereof being shown in FIG. 31A. A CPU (microcomputer) 510 has various functions, including that of controlling the entire system. An operating section 511 is designed to enable the user to operate the printer. Data such as a control program and fonts is stored in a ROM 516, and a RAM 517 functions as a work area for the CPU 510. A DMAC 518 is a DMA controller for transferring data through the CPU 510. A display panel 519 is designed to inform the user of the operational state of the printer.

Serial print data that has been send in from another device such as a personal computer via USB is converted into parallel print data by a data transfer control device 500. The thus converted parallel print data is sent to a print processing section (a printer engine) 512 by the CPU 510 or the DMAC 518. This parallel print data is subjected to given processing in the print processing section 512 and is output for printing to paper by a print section (a device for outputting data) 514 comprising components such as a print head.

Figure 30B:
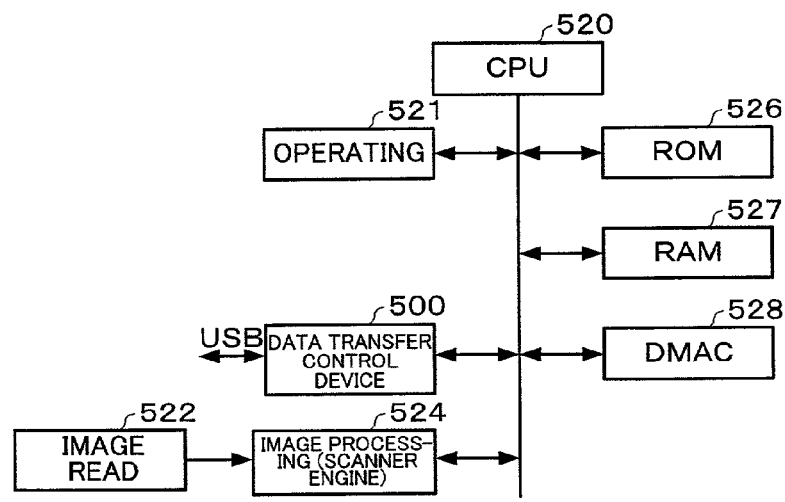
Figure 31B:
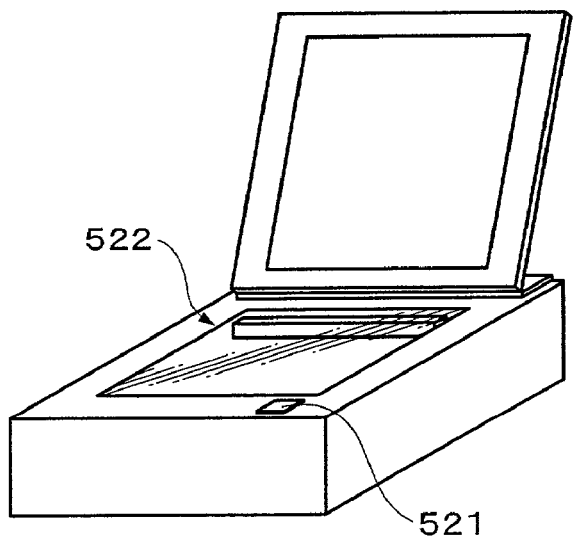

An internal block diagram of a scanner that is another example of electronic instruments is shown in FIG. 30B with an external view thereof being shown in FIG. 31B. A CPU 520 has various functions, including that of controlling the entire system. An operating section 521 is designed to enable the user to operate the scanner. Data such as a control program is stored in a ROM 526, and a RAM 527 functions as a work area for the CPU 520. A DMAC 528 is a DMA controller.

An image of a document is read in by an image read section (a device for fetching data) 522, which comprises components such as a light source and an opto-electric converter, and data of the read-in image is processed by an image processing section (a scanner engine) 524. The processed image data is sent to the data transfer control device 500 by the CPU 520 or DMAC 528. The data transfer control device 500 converts that parallel image data into serial data and sends it to another device such as a personal computer via USB.

Figure 30C:
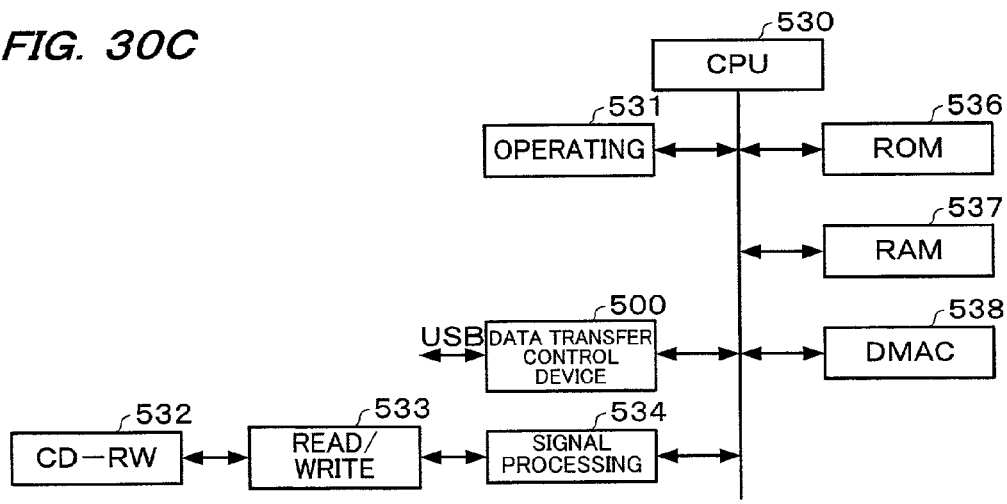
Figure 31C:
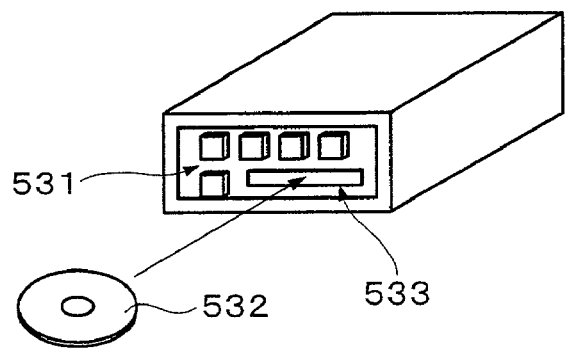

An internal block diagram of a CD-RW drive that is a further example of an electronic instrument is shown in FIG. 30C with an external view thereof being shown in FIG. 31C. A CPU 530 has various functions, including that of controlling the entire system. An operating section 531 is designed to enable the user to operate the CD-RW drive. Data such as a control program is stored in a ROM 536, and a RAM 537 functions as a work area for the CPU 530. A DMAC 538 is a DMA controller.

Data read out from a CD-RW 532 by a read/write section (a device for fetching data or a device for storing data) 533, which comprises components such as a laser, a motor, and an optical system, is input to a signal processing section 534 where it is subjected to given signal processing such as error correction. The data that has been subjected to this signal processing is sent to the data transfer control device 500 by the CPU 530 or the DMAC 538. The data transfer control device 500 converts this parallel data into serial data, then sends it to another device such as a personal computer via USB.

Serial data that comes in from another device via USB, on the other hand, is converted into parallel data by the data transfer control device 500. This parallel data is sent to the signal processing section 534 by the CPU 530 or the DMAC 538. This parallel data is subjected to given signal processing by the signal processing section 534 then is stored by the read/write section 533 on the CD-RW 532.

Note that a separate CPU for controlling data transfer by the data transfer control device 500 could be provided in addition to the CPU 510, 520, or 530 of FIGS. 30A, 30B, and 30C.

Use of the data transfer control device of this embodiment in an electronic instrument makes it possible to generate a sampling clock that can sample even transfer data that is being transferred at a high transfer rate. It is therefore possible to implement data transfer in the HS mode in accordance with USB 2.0, by way of example. When a user uses a personal computer or the like to specify a printout, it is therefore possible to complete printing with only a small time lag. Similarly, the user can view an image that is read in with only a small time lag after a scanner has been instructed to fetch the image. It also makes it possible to read data from a CD-RW and write data to a CD-RW at high speed.

Use of the data transfer control device of these embodiments in an electronic insrument also makes it possible to fabricate an IC for the data transfer control device by ordinary semiconductor processes, which have low fabrication costs. It is therefore possible to reduce the cost of the data transfer control device and thus reduce the cost of the an electronic instrument.

Note that the electronic instrument that can employ a data transfer control device in accordance with the present invention is not limited to the above described embodiments, and thus various other examples can be considered, such as various types of optical disk drive (CD-ROM or DVD), magneto-optical (MO) disk drives, hard disk drives, TVs, VCRs, video cameras, audio equipment, telephones, projectors, personal computers, electronic organizers, and dedicated wordprocessors.

Note also that the present invention is not limited to the embodiments described herein, and various modifications are possible within the scope of the invention laid out herein.

For example, the configuration of the data transfer control device in accordance with the present invention is not limited to that shown in FIGS. 1, 7, 12, 14, and 15.

In addition, the methods of arranging the inversion and buffer circuits, together with the feedback, dummy, and clock lines, are not limited to the methods shown in FIGS. 2A to 10, and 26 to 29 and thus various equivalent modifications are possible.

Furthermore, the number of stages of inversion circuits and buffer circuits is not limited to five.

The configuration of the data transfer control device in accordance with the present invention is not limited to that shown in FIG. 11.

Similarly, the configurations of the edge detection circuit and clock selection circuit are not limited to those shown in FIG. 19. For example, the edge detection circuit could have a configuration such that it can at least detect a data edge and output that edge detection information to the clock selection circuit.

Furthermore, the number of multi-phase clocks N is also not limited to five. If the latest semiconductor processes are used for constructing the sampling clock generation circuit, it may be possible to shorten the signal values of the inversions circuits and the set-up and hold times of the holding circuits further. In such a case, therefore, it would be possible to increase the number of clocks to more than five.

It is particularly desirable to apply the present invention to data transfer under USB 2.0, but it is not limited thereto. For example, the present invention can also be applied to data transfer in accordance with a standard that is based on a concept similar to that of USB 2.0, or a standard that is developed from USB 2.0.

What is claimed is:

1. A clock generation circuit comprising:
   first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and
   first to Nth buffer circuits having inputs connected to outputs of the first to Nth inversion circuits,
   wherein the first to Nth inversion circuits are disposed along a first line that is parallel to the feedback line;
   wherein the first to Nth buffer circuits are disposed along a second line that is parallel to the feedback line but different from the first line; and
   wherein the feedback line is disposed in a region between a region in which the first to Nth inversion circuits are disposed and a region in which the first to Nth buffer circuits are disposed.

2. A clock generation circuit comprising:
   first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and
   first to Nth buffer circuits having inputs connected to outputs of the first to Nth inversion circuits,
   wherein the first to Nth inversion circuits are disposed along a first line that is parallel to the feedback line;
   wherein the first to Nth buffer circuits are disposed along a second line that is parallel to the feedback line but different from the first line;
   wherein the first to Nth inversion circuits are differential-output type inversion circuits;
   wherein the first to Nth buffer circuits are differential-input type buffer circuits to which are input differential outputs from the first to Nth inversion circuits;
   wherein the feedback line includes a feedback line pair connected to a differential output of the Nth inversion circuit; and
   wherein the feedback line pair is disposed in a region between a region in which the first to Nth inversion circuits are disposed and a region in which the first to Nth buffer circuits are disposed.

3. A clock generation circuit comprising:
first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and
first to Nth buffer circuits having inputs connected to outputs of the first to Nth inversion circuits,
wherein the first to Nth inversion circuits are disposed along a first line that is parallel to the feedback line;
wherein the first to Nth buffer circuits are disposed along a second line that is parallel to the feedback line but different from the first line; and
wherein first to (N−1)th dummy lines are connected to the corresponding outputs of the first to (N−1)th inversion circuits and each of the first to (N−1)th dummy lines has parasitic capacitance equal to the parasitic capacitance of the feedback line connected to the output of the Nth inversion circuit.

4. The clock generation circuit as defined in claim 3,
wherein the feedback line and the first to (N−1)th dummy lines are disposed in a region between a region in which the first to Nth inversion circuits are disposed and a region in which the first to Nth buffer circuits are disposed.

5. The clock generation circuit as defined in claim 3, wherein:
the first to Nth inversion circuits are differential-output type inversion circuits;
the first to Nth buffer circuits are differential-input type buffer circuits to which are input differential outputs from the first to Nth inversion circuits;
the feedback line includes a feedback line pair connected to a differential output of the Nth inversion circuit; and
the first to (N−1)th dummy lines include first to (N−1)th dummy line pairs connected to differential outputs of the first to (N−1)th inversion circuits; and
the feedback line pair and the first to (N−1)th dummy line pairs are disposed in a region between a region in which the first to Nth inversion circuits are disposed and a region in which the first to Nth buffer circuits are disposed.

6. A clock generation circuit comprising:
first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and
first to Nth buffer circuits having inputs connected to outputs of the first to Nth inversion circuits,
wherein first to (N−1)th dummy lines are connected to the corresponding outputs of the first to (N−1)th inversion circuits and each of the first to (N−1)th dummy lines has parasitic capacitance equal to the parasitic capacitance of the feedback line connected to the output of the Nth inversion circuit.

7. A clock generation circuit comprising:
first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and
first to Nth buffer circuits having inputs connected to outputs of the first to Nth inversion circuits,
wherein the first to Nth inversion circuits are disposed along a first line that is parallel to the feedback line;
wherein the first to Nth buffer circuits are disposed along a second line that is parallel to the feedback line but different from the first line; and
wherein clock generation circuit further comprising:
an edge detection circuit which detects between which two edges of first to Nth clocks a data edge is located, the first to Nth clocks being obtained on the basis of outputs of the first to Nth buffer circuits; and
a clock selection circuit which selects one of the first to Nth clocks, based on edge detection information from the edge detection circuit, and outputs the selected clock as a sampling clock for sampling data.

8. The clock generation circuit as defined in claim 6, further comprising:
an edge detection circuit which detects between which two edges of first to Nth clocks a data edge is located, the first to Nth clocks being obtained on the basis of outputs of the first to Nth buffer circuits; and
a clock selection circuit which selects one of the first to Nth clocks, based on edge detection information from the edge detection circuit, and outputs the selected clock as a sampling clock for sampling data.

9. The clock generation circuit as defined in claim 7,
wherein lines for the first to Nth clocks are disposed in such a manner that the parasitic capacitances of the lines for the first to Nth clocks are equal.

10. The clock generation circuit as defined in claim 8,
wherein lines for the first to Nth clocks are disposed in such a manner that the parasitic capacitances of the lines for the first to Nth clocks are equal.

11. The clock generation circuit as defined in claim 7, wherein:
the edge detection circuit has a first holding circuit which holds data by using a first clock, . . . a Jth holding circuit which holds data by using a Jth clock (where: $1<J<N$), . . . and an Nth holding circuit which holds data by using an Nth clock;
the first to Nth holding circuits are disposed along a line parallel to the lines of the first to Nth clocks;
the lines of the first to Nth clocks are connected to inputs of the first to Nth holding circuits, after being looped back in the opposite direction at first to Nth loop-back points; and
the first to Nth loop-back points are provided at positions such that the parasite capacitances of the lines of the first to Nth clocks are equal.

12. The clock generation circuit as defined in claim 8, wherein:
the edge detection circuit has a first holding circuit which holds data by using a first clock, . . . a Jth holding circuit which holds data by using a Jth clock (where: $1<J<N$), . . . and an Nth holding circuit which holds data by using an Nth clock;
the first to Nth holding circuits are disposed along a line parallel to the lines of the first to Nth clocks;
the lines of the first to Nth clocks are connected to inputs of the first to Nth holding circuits, after being looped back in the opposite direction at first to Nth loop-back points; and
the first to Nth loop-back points are provided at positions such that the parasite capacitances of the lines of the first to Nth clocks are equal.

13. The clock generation circuit as defined in claim 7, wherein the edge detection circuit comprises:

a first holding circuit which holds data by using a first clock, . . . a Jth holding circuit which holds data by using a Jth clock (where: 1<J<N), . . . and an Nth holding circuit which holds data by using an Nth clock; and a first detection circuit which detects whether or not there is a data edge between the edges of the first clock and a second clock, based on data held in the first holding circuit and a second holding circuit, . . . a Jth detection circuit which detects whether or not there is a data edge between the edges of the Jth clock and a (J+1) th clock, based on data held in the Jth holding circuit and a (J+1)th holding circuit, . . . and an Nth detection circuit which detects whether or not there is a data edge between the edges of the Nth clock and the first clock, based on data held in the Nth holding circuit and the first holding circuit; and wherein the clock selection circuit selects a clock from among the first to Nth clocks, based on edge detection information from the first to Nth detection circuits, and outputs the selected clock as the sampling clock.

14. The clock generation circuit as defined in claim 8, wherein the edge detection circuit comprises:

a first holding circuit which holds data by using a first clock, . . . a Jth holding circuit which holds data by using a Jth clock (where: 1<J<N), . . . and an Nth holding circuit which holds data by using an Nth clock; and a first detection circuit which detects whether or not there is a data edge between the edges of the first clock and a second clock, based on data held in the first holding circuit and a second holding circuit, . . . a Jth detection circuit which detects whether or not there is a data edge between the edges of the Jth clock and a (J+1)th clock, based on data held in the Jth holding circuit and a (J+1)th holding circuit, . . . and an Nth detection circuit which detects whether or not there is a data edge between the edges of the Nth clock and the first clock, based on data held in the Nth holding circuit and the first holding circuit, and wherein the clock selection circuit selects a clock from among the first to Nth clocks, based on edge detection information from the first to Nth detection circuits, and outputs the selected clock as the sampling clock.

15. The clock generation circuit as defined in claim 13, wherein:

when a set-up time of the first to Nth holding circuits is TS, a hold time of the first to Nth holding circuits is TH, and a period of each of the first to Nth clocks is T, the number of clocks N of the first to Nth clocks is given by: $N \leq [T/(TS+TH)]$ (where [X] is the maximum integer that does not exceed X).

16. The clock generation circuit as defined in claim 14, wherein:

when a set-up time of the first to Nth holding circuits is TS, a hold time of the first to Nth holding circuits is TH, and a period of each of the first to Nth clocks is T, the number of clocks N of the first to Nth clocks is given by: $N \leq [T/(TS+TH)]$ (where [X] is the maximum integer that does not exceed X).

17. The clock generation circuit as defined in claim 15, wherein the number of clocks N is defined by $N=[T/(TS+TH)]$ (where [X] is the maximum integer that does not exceed X).

18. The clock generation circuit as defined in claim 16, wherein the number of clocks N is defined by $N=[T/(TS+TH)]$ (where [X] is the maximum integer that does not exceed X).

19. The clock generation circuit as defined in claim 13, wherein the number of clocks N of the first to Nth clocks is such that N=5.

20. The clock generation circuit as defined in claim 14, wherein the number of clocks N of the first to Nth clocks is such that N=5.

21. The clock generation circuit as defined in claim 15, wherein the number of clocks N of the first to Nth clocks is such that N=5.

22. The clock generation circuit as defined in claim 16, wherein the number of clocks N of the first to Nth clocks is such that N=5.

23. The clock generation circuit as defined in claim 17, wherein the number of clocks N of the first to Nth clocks is such that N=5.

24. The clock generation circuit as defined in claim 18, wherein the number of clocks N of the first to Nth clocks is such that N=5.

25. The clock generation circuit as defined in claim 7, wherein the clock selection circuit selects a clock having an edge that is shifted by a given set number M of edges from a data edge, from among the first to Nth clocks, and outputs the selected clock as the sampling clock.

26. The clock generation circuit as defined in claim 8, wherein:

wherein the clock selection circuit selects a clock having an edge that is shifted by a given set number M of edges from a data edge, from among the first to Nth clocks, and outputs the selected clock as the sampling clock.

27. The clock generation circuit as defined in claim 25, wherein the number M is set to a number that ensures set-up and hold times of a circuit which holds data based on the generated sampling clock.

28. The clock generation circuit as defined in claim 26, wherein the number M is set to a number that ensures set-up and hold times of a circuit which holds data based on the generated sampling clock.

29. A data transfer control device for transferring data over a bus, the data transfer control device comprising:

a clock generation circuit; and a circuit which holds data based on a sampling clock generated by the clock generation circuit, and performs given processing for data transfer, based on the held data, wherein the clock generation circuit comprising:

first to Nth inversion circuits in which an output of each previous-stage Kth ($1 \leq K \leq N-1$) inversion circuit is connected to an input of the corresponding next-stage (K+1)th inversion circuit and an output of the Nth inversion circuit is connected by a feedback line to an input of the first inversion circuit; and first to Nth buffer circuits having inputs connected to outputs of the first to Nth inversion circuits, wherein the first to Nth inversion circuits are disposed along a first line that is parallel to the feedback line;

wherein the first to Nth buffer circuits are disposed along a second line that is parallel to the feedback line but different from the first line.

30. A data transfer control device for transferring data over a bus, the data transfer control device comprising:
the clock generation circuit as defined in claim 6; and
a circuit which holds data based on a sampling clock generated by the clock generation circuit, and performs given processing for data transfer, based on the held data.

31. A data transfer control device for transferring data over a bus, the data transfer control device comprising:
the clock generation circuit as defined in claim 7; and
a circuit which holds data based on a sampling clock generated by the clock generation circuit, and performs given processing for data transfer, based on the held data.

32. A data transfer control device for transferring data over a bus, the data transfer control device comprising:
the clock generation circuit as defined in claim 8; and
a circuit which holds data based on a sampling clock generated by the clock generation circuit, and performs given processing for data transfer, based on the held data.

33. The data transfer control device as defined in claim 29, wherein data transfer is in accordance with the universal serial bus (USB) standard.

34. The data transfer control device as defined in claim 30, wherein data transfer is in accordance with the universal serial bus (USB) standard.

35. The data transfer control device as defined in claim 31, wherein data transfer is in accordance with the universal serial bus (USB) standard.

36. The data transfer control device as defined in claim 32, wherein data transfer is in accordance with the universal serial bus (USB) standard.

37. An electronic instrument comprising:
the data transfer control device as defined in claim 29; and
a device which performs output processing, fetch processing or storage processing on data transferred through the data transfer control device and the bus.

38. An electronic instrument comprising:
the data transfer control device as defined in claim 30; and
a device which performs output processing, fetch processing or storage processing on data transferred through the data transfer control device and the bus.

39. An electronic instrument comprising:
the data transfer control device as defined in claim 31; and
a device which performs output processing, fetch processing or storage processing on data transferred through the data transfer control device and the bus.

40. An electronic instrument comprising:
the data transfer control device as defined in claim 32; and
a device which performs output processing, fetch processing or storage processing on data transferred through the data transfer control device and the bus.

41. An electronic instrument comprising:
the data transfer control device as defined in claim 33; and
a device which performs output processing, fetch processing or storage processing on data transferred through the data transfer control device and the bus.

42. An electronic instrument comprising:
the data transfer control device as defined in claim 34; and
a device which performs output processing, fetch processing or storage processing on data transferred through the data transfer control device and the bus.

43. An electronic instrument comprising:
the data transfer control device as defined in claim 35; and
a device which performs output processing, fetch processing or storage processing on data transferred through the data transfer control device and the bus.

44. An electronic instrument comprising:
the data transfer control device as defined in claim 36; and
a device which performs output processing, fetch processing or storage processing on data transferred through the data transfer control device and the bus.

* * * * *